(12) United States Patent
Yang et al.

(10) Patent No.: US 10,678,130 B2
(45) Date of Patent: *Jun. 9, 2020

(54) PHOTOSENSITIVE COMPOSITIONS AND QUANTUM DOT POLYMER COMPOSITE PATTERNS INCLUDING THE SAME

(71) Applicants: Samsung Electronics Co., Ltd., Suwon-si, Gyeonggi-do (KR); SAMSUNG DISPLAY CO., LTD., Yongin-si, Gyeonggi-do (KR); SAMSUNG SDI CO., LTD., Yongin-si, Gyeonggi-do (KR)

(72) Inventors: Hyeyeon Yang, Yongin-si (KR); Tae Hyung Kim, Seoul (KR); Shang Hyeun Park, Yongin-si (KR); Shin Ae Jun, Seongnam-si (KR); Yong Seok Han, Anyang-si (KR); Eun Joo Jang, Suwon-si (KR); Deukseok Chung, Yongin-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,984

(22) Filed: Jun. 17, 2019

(65) Prior Publication Data

US 2019/0310549 A1    Oct. 10, 2019

Related U.S. Application Data

(63) Continuation of application No. 15/924,814, filed on Mar. 19, 2018, now Pat. No. 10,324,373, and a
(Continued)

(30) Foreign Application Priority Data

Oct. 21, 2015    (KR) .................. 10-2015-0146973

(51) Int. Cl.
*G02F 1/1335*    (2006.01)
*G02B 5/20*    (2006.01)
(Continued)

(52) U.S. Cl.
CPC .......... *G03F 7/0007* (2013.01); *G02B 5/223* (2013.01); *G03F 7/0045* (2013.01);
(Continued)

(58) Field of Classification Search
CPC ........ G03F 7/0007; G03F 7/028; G03F 7/031; G03F 7/033; G03F 7/20; G03F 7/2002;
(Continued)

(56) References Cited

U.S. PATENT DOCUMENTS 7,393,618 B2    7/2008    Ioku et al.
7,417,368 B2    8/2008    Wu et al.
(Continued)

FOREIGN PATENT DOCUMENTS

CN    104479680 A    4/2015
JP    2006-503418 A    1/2006
KR    10-2013-0000506 A    1/2013

OTHER PUBLICATIONS

Jonathan E. Halpert, et al., "Electrostatic Formation of Quantum Dot/J-aggregate FRET Paris in Solution", J. Phys. Chem. C 2009, 113, 9986-9992.
(Continued)

*Primary Examiner* — John A McPherson
(74) *Attorney, Agent, or Firm* — Cantor Colburn LLP

(57) ABSTRACT

A photosensitive composition and a quantum dot-polymer composite pattern formed from the photosensitive compo-
(Continued)

sition are disclosed, and the photosensitive composition includes:
- a plurality of quantum dots;
- a color filter material including an absorption dye, an absorption pigment, or a combination thereof;
- a polymer binder;
- a photopolymerizable monomer having a carbon-carbon double bond;
- a photoinitiator; and
- a solvent, wherein in a normalized photoluminescence spectrum of the quantum dot and a normalized ultraviolet-visible absorption spectrum of the color filter material, a photoluminescence peak wavelength (PL peak wavelength) of the quantum dot and a wavelength of maximum absorbance of the color filter material do not overlap with each other, and the color filter material is included in an amount of less than or equal to 1 part by weight per 10 parts by weight of the plurality of quantum dots.

32 Claims, 19 Drawing Sheets

Related U.S. Application Data continuation of application No. 15/295,332, filed on Oct. 17, 2016, now Pat. No. 9,921,472.

(51) Int. Cl.

| | |
|---|---|
| G03F 7/00 | (2006.01) |
| G03F 7/16 | (2006.01) |
| G03F 7/20 | (2006.01) |
| G03F 7/32 | (2006.01) |
| G03F 7/40 | (2006.01) |
| G03F 7/033 | (2006.01) |
| G03F 7/031 | (2006.01) |
| G03F 7/004 | (2006.01) |
| G03F 7/028 | (2006.01) |
| G03F 7/027 | (2006.01) |
| G03F 7/105 | (2006.01) |
| G02B 5/22 | (2006.01) |

(52) U.S. Cl.
CPC ............ *G03F 7/0047* (2013.01); *G03F 7/027* (2013.01); *G03F 7/028* (2013.01); *G03F 7/031* (2013.01); *G03F 7/033* (2013.01); *G03F 7/105* (2013.01); *G03F 7/162* (2013.01); *G03F 7/168* (2013.01); *G03F 7/2002* (2013.01); *G03F 7/322* (2013.01); *G03F 7/40* (2013.01); *G02F 1/133516* (2013.01)

(58) Field of Classification Search
CPC ........ G02B 5/201; G02B 5/206; G02B 5/223; G02F 1/133514; G02F 1/133516
USPC .................................................. 430/281.1, 7
See application file for complete search history.

(56) References Cited

U.S. PATENT DOCUMENTS

| | | | |
|---|---|---|---|
| 7,579,769 B2 | 8/2009 | Wu et al. | |
| 9,921,472 B2* | 3/2018 | Yang | .................... G03F 7/0047 |
| 10,324,373 B2* | 6/2019 | Yang | .................... G03F 7/0047 |
| 2008/0070153 A1* | 3/2008 | Ioku | ........................ C09K 11/62 |
| | | | 430/270.1 |
| 2012/0292169 A1 | 11/2012 | Purdy et al. | |
| 2013/0070443 A1 | 3/2013 | Pan et al. | |
| 2015/0108406 A1 | 4/2015 | Radovanovic et al. | |
| 2016/0178966 A1 | 6/2016 | Li et al. | |
| 2016/0362602 A1 | 12/2016 | Xin et al. | |
| 2017/0023830 A1 | 1/2017 | Yang et al. | |

OTHER PUBLICATIONS

Non-Final Office Action dated May 25, 2017 issued for U.S. Appl. No. 15/295,332.
Non-Final Office Action dated Sep. 27, 2018 issued for U.S. Appl. No. 15/924,814.
Pushpendra Kumar et al. "Global analysis of quenching of the time-resolved emission of ZnO nanocrystals by adsorbed rhodamine B on the basis of Tachiya theory", Journal of Photochemistry and Photobiology A.: Chemistry 296(2015) 35-39.
Seung-Yeon Kwak et al. "High color rendering white light-emitting diodes based on a green silicate phosphor mixed with a red dye-bridged hybrid", RSC Advances, 2012, 2, 12371-12377.

* cited by examiner

FIG. 1
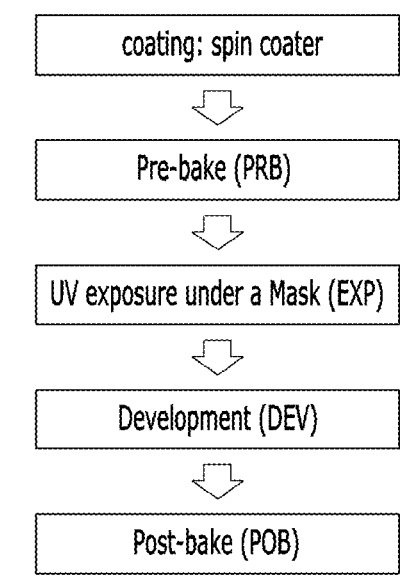
Repeating the Patterning Process three times

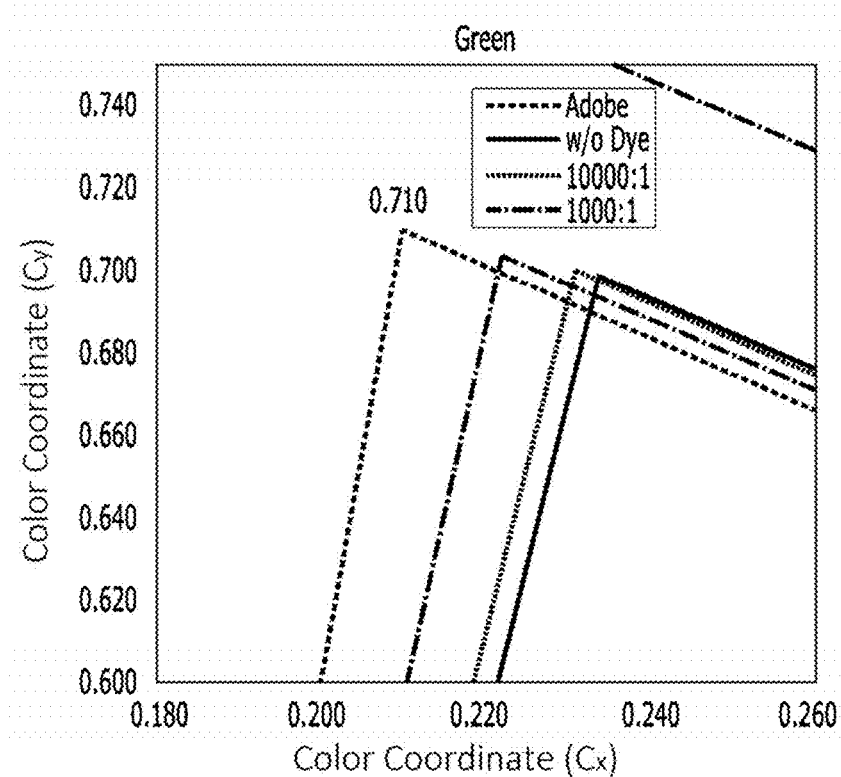

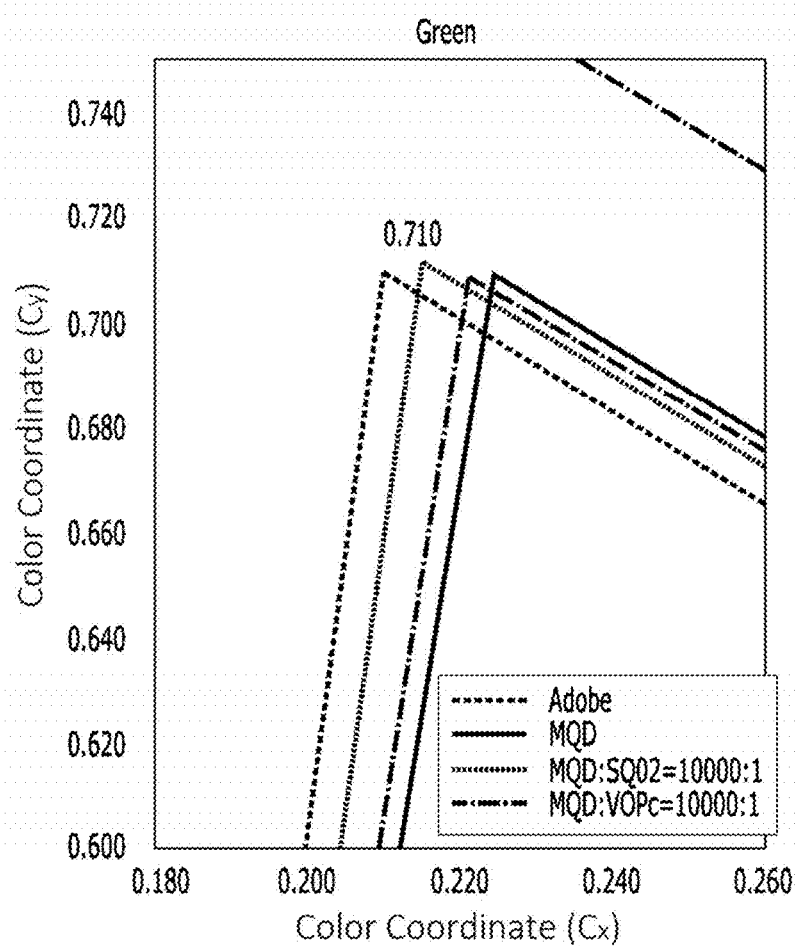

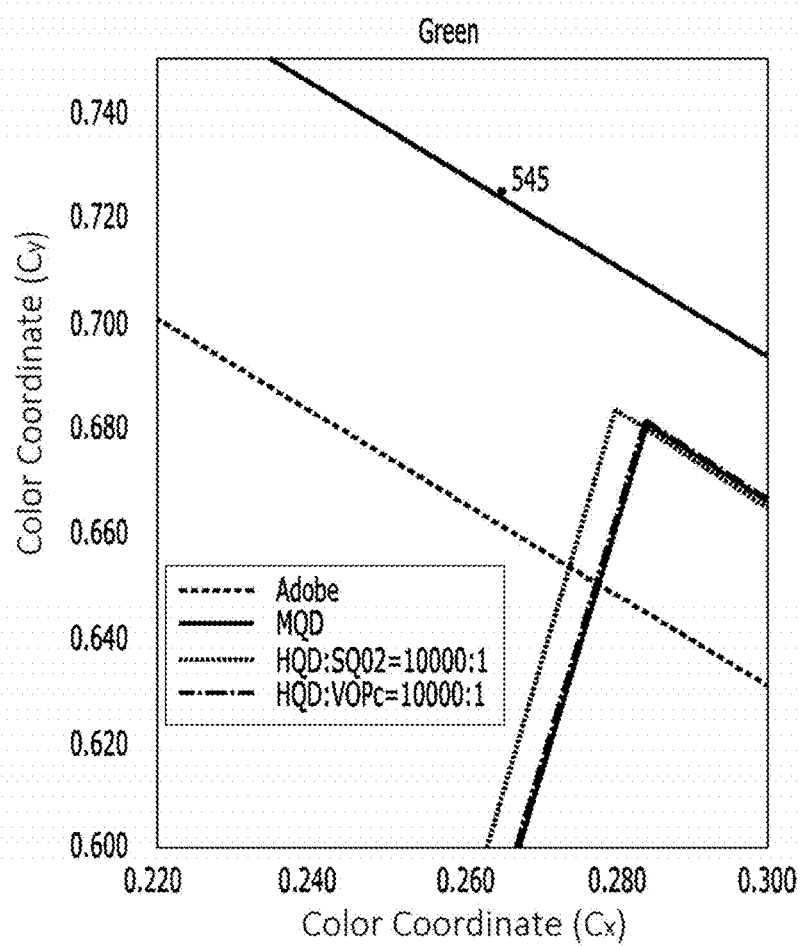

PHOTOSENSITIVE COMPOSITIONS AND QUANTUM DOT POLYMER COMPOSITE PATTERNS INCLUDING THE SAME

CROSS-REFERENCE TO RELATED APPLICATION

This application is a continuation of U.S. patent application Ser. No. 15/924,814 filed in the United States Patent and Trademark Office on Mar. 19, 2018, which a continuation of U.S. patent application Ser. No. 15/295,332 filed in the United States Patent and Trademark Office on Oct. 17, 2016, which claims priority to and the benefit of Korean Patent Application No. 10-2015-0146973 filed in the Korean Intellectual Property Office on Oct. 21, 2015, and all benefits accruing therefrom under 35 U.S.C. § 119, the entire contents of which applications are incorporated herein by reference.

BACKGROUND

1. Field

Photosensitive compositions and quantum dot-polymer composite patterns are disclosed.

2. Description of the Related Art

A liquid crystal display (hereinafter, "LCD") is a display in which polarized light passed through liquid crystal expresses a color while passing through an absorptive color filter. Unfavorably, LCDs have a narrow viewing angle and a low luminance due to low light transmittance of the absorptive color filter. When the LCD employs a photoluminescent type color filter, it may widen the viewing angle and improve the luminance.

Quantum dots, which are dispersed in a polymer host matrix to provide a composite, are applicable for various display devices. Quantum dots ("QD") may be used as a light conversion layer in a light emitting diode ("LED") or the like by being dispersed in a host matrix of an inorganic material or a polymer. When a quantum dot is synthesized as a colloidal solution, the particle size may be relatively freely and uniformly controlled. When a quantum dot has a size of less than or equal to about 10 nanometers ("nm"), the quantum confinement effects in which the bandgap is more increased according to decreasing a size become significant, thus the energy density is enhanced.

The quantum dot-polymer composite pattern may be applied to the various devices, for example, a liquid crystal display.

SUMMARY

An embodiment provides a photosensitive composition capable of a pattern of a quantum dot-polymer composite.

Another embodiment provides a pattern of a quantum dot-polymer composite prepared from the composition.

Yet another embodiment provides an electronic device including the pattern of the quantum dot-polymer composite.

In an embodiment, a photosensitive composition includes a plurality of quantum dots;
a color filter material including an absorption dye, an absorption pigment, or a combination thereof;
a polymer binder;
a photopolymerizable monomer having a carbon-carbon double bond;
a photoinitiator; and
a solvent, wherein in a normalized photoluminescence (PL) spectrum of the quantum dot and a normalized ultraviolet-visible absorption spectrum of the color filter material, a range of a photoluminescence peak wavelength of the quantum dot and a range of a wavelength of maximum absorbance of the color filter material do not overlap with each other, and the color filter material is included in an amount of less than or equal to 1 part by weight per 10 parts by weight of the plurality of quantum dots.

In an embodiment, a method for the manufacture of a quantum dot polymer composite pattern includes preparing a binder solution comprising a polymer binder and a solvent; dispersing a plurality of quantum dots and a color filter material in the binder solution to obtain a binder dispersion comprising a dispersion of the quantum dots, the color filter material, and a binder; mixing the binder dispersion with at least one of a photopolymerizable monomer, a photoinitiator, the solvent, or a combination thereof, to form a photosensitive composition; and preparing the quantum dot polymer composite pattern from the photosensitive compound; wherein in a normalized photoluminescence spectrum of a quantum dot and a normalized ultraviolet-visible absorption spectrum of the color filter material, a range of a photoluminescence peak wavelength of the quantum dot and a range of a wavelength of maximum absorbance of the color filter material do not overlap with each other, and the color filter material is included in an amount of less than or equal to 1 part by weight per 10 parts by weight of the plurality of quantum dots.

An absorption initiation wavelength of the color filter material may be present before (i.e., on the left side of) or within a longer wavelength tail region of the quantum dot.

An absorption termination wavelength of the ultraviolet absorption spectrum of the color filter material may be present within or after (i.e., on the right side of) a shorter wavelength tail region of the quantum dot.

The range of the photoluminescence peak wavelength of the quantum dot may be from about 500 nm to about 550 nm, and the color filter material may have an absorption initiation wavelength of greater than or equal to about 500 nm.

The range of the photoluminescence peak wavelength of the quantum dot may be from about 600 nm to about 700 nm and the color filter material may have an absorption initiation wavelength of greater than or equal to about 600 nm.

The range of the photoluminescence peak wavelength of the quantum dot may be from about 600 nm to about 700 nm, and the color filter material may have an absorption initiation wavelength between about 480 nm and about 600 nm.

The quantum dot may have an organic ligand having a hydrophobic moiety on a surface thereof, and the organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 aliphatic hydrocarbon group or a C5 to C20 aromatic hydrocarbon group), or a combination thereof.

The quantum dot may include a Group II-VI compound, a Group III-V compound, a Group IV-VI compound, a Group IV compound, a Group compound, a Group I-II-IV-IV compound, or a combination thereof.

The absorption dye or pigment may include an organometallic complex, a coumarin compound, a rhodamine compound, a phenoxazone compound, a stilbene compound, a terphenyl compound, a quaterphenyl compound, a perylene compound, a diketopyrrolopyrrole compound, a phthalocyanine compound, anthraquinone compound, a squaraine compound, or a combination thereof.

The polymer binder may have a carboxyl group, and may have an acid value of greater than or equal to about 50 milligrams of potassium hydroxide per gram of the polymer binder (mg KOH/g).

The photosensitive composition may include
about 5 wt % to about 40 wt % of the quantum dot;
about 0.5 wt % to about 30 wt % of the carboxyl group-containing binder;
about 0.5 wt % to about 20 wt % of the photopolymerizable monomer;
about 0.01 wt % to about 10 wt % of the photoinitiator; and
a balance amount of the solvent based on the total weight of the composition,
wherein the color filter material is included in amount of less than about 10 parts by weight per 100 parts by weight of the quantum dot.

In another embodiment, a quantum dot polymer composite pattern may be prepared from the photosensitive composition.

A photoluminescence spectrum of the quantum dot-polymer composite pattern may have an area at about 580 nm to about 650 nm that is decreased by at least about 10% when being compared with the original area of the quantum dot at about 580 nm to about 650 nm. A NTSC color coordinate of the quantum dot-polymer composite pattern may be larger than NTSC color coordinate of the quantum dot.

Another embodiment provides an electronic device including the aforementioned quantum dot polymer composite pattern.

The aforementioned photosensitive composition may provide a quantum dot-polymer composite that may exhibit enhanced color gamut ratio.

BRIEF DESCRIPTION OF THE DRAWINGS

FIG. 1 shows a process for preparing a pattern for a color filter using a photosensitive composition (e.g., photoresist composition) according to an embodiment.

FIG. 7 is a graph of color coordinate ($C_y$) versus color coordinate ($C_x$) and shows a portion of color coordinates of a quantum dot and a mixture solution of a quantum dot and an absorption dye in Example 1-1.

FIGS. 8A, 8B, 8C, and 8D are each a graph of color coordinate ($C_y$) versus color coordinate ($C_x$) and shows a portion of color coordinates of quantum dot-polymer composite films in Example 6.

DETAILED DESCRIPTION

Figure 2:
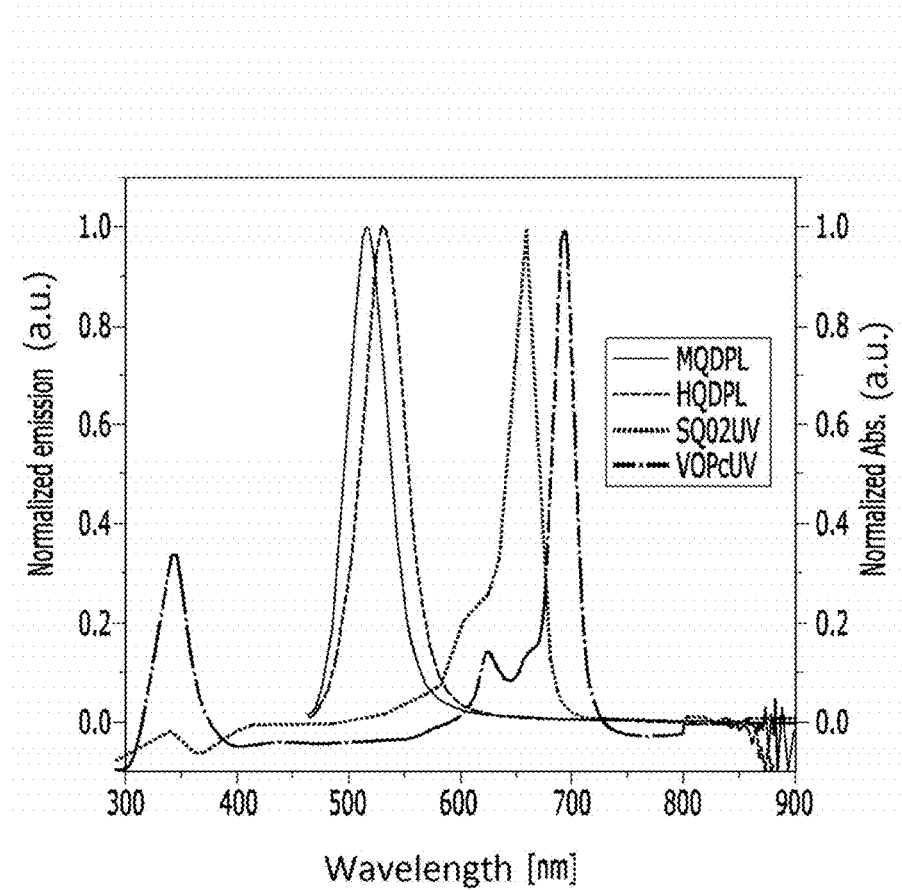
FIG. 2 shows a graph of normalized emission (arbitrary units, a.u.) versus wavelength (nanometers, nm), which is a normalized photoluminescence spectrum of two types of quantum dots; and a graph of normalized absorbance (a.u.) versus wavelength (nm), which is a normalized ultraviolet-visible (UV-vis) absorption spectrum of two types of absorption dyes in Examples 1 to 4.

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Similar reference numerals designate similar elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to the case where at least one of hydrogen atoms of a compound is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "alkylene group" may refer to a straight or branched saturated aliphatic hydrocarbon group that has a valence of at least two and may optionally have at least one substituent. The term "arylene group" may refer to a functional group having a valence of at least two that is obtained by removal of at least two hydrogens in at least one aromatic ring and may optionally have at least one substituent.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency of repelling water. For example, the hydrophobic moiety may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, aralkyl group, etc.), or an alicyclic hydrocarbon group of having a carbon number of greater than or equal to 5 (cyclohexyl, norbornene, etc.). The hydrophobic moiety substantially lacks an ability of making a hydrogen bond with an ambient medium and is not substantially mixed with the medium as its polarity is not matched with that of the medium.

As used herein, the terms "ultraviolet" and "UV" are interchangeable, and refer to light having a wavelength of about 200 nm to about 400 nm.

As used herein, the term "photoluminescence peak wavelength" refers to a wavelength showing a maximum photoluminescence intensity, and the term "a range of a photoluminescence peak wavelength" refers to a range of the photoluminescence peak wavelength that can be selected considering luminance and color coordinate. For example, the range of a photoluminescence peak wavelength of a red light emitting quantum dot may be from about 600 nm to about 700 nm. For example, the range of a photoluminescence peak wavelength of a green light emitting quantum dot may be about 500 nm to about 550 nm.

As used herein, the term "wavelength of maximum absorbance" refers to a wavelength showing maximum absorption, and the term "a range of a wavelength of maximum absorbance" refers to a wavelength range where in a curve including a wavelength of maximum absorbance, normalized absorption intensity is greater than or equal to about 20% (or greater than or equal to about 30%).

As used herein, the term "normalized UV absorption spectrum" refers to a graph obtained by normalizing an absorption intensity at an wavelength (hereinafter, intensity$_\lambda$) with respect to the absorption intensity at a wavelength showing the highest absorbance (hereinafter, Intensity$_{\lambda max}$) and plotting the normalized absorption intensity (intensity$_\lambda$) over the entire values of the wavelength. The normalization is made by dividing the intensity$_\lambda$ with the Intensity$_{\lambda max}$.

As used herein, the term "an absorption initiation wavelength of a color filter material" refers to a wavelength (e.g., shortest wavelength) at which an absorption intensity of a curve including a wavelength of maximum absorbance is about 5% (0.05 relative maximum intensity of 1.0), in a normalized UV absorption spectrum of the color filter material.

As used herein, the term "an absorption termination wavelength of a color filter material" refers to a wavelength (e.g., longest wavelength) at which an absorption intensity of a curve including a wavelength of maximum absorbance is about 5% in a normalized UV absorption spectrum of the color filter material.

As used herein, the term "a long wavelength tail region of a photoluminescence spectrum of a quantum dot" refers to a wavelength region of greater than or equal to about 570 nm in a curve including a photoluminescence peak wavelength for a green light emitting quantum dot, and a wavelength region of greater than or equal to about 660 nm in a curve including a photoluminescence peak wavelength for a red light emitting quantum dot.

As used herein, the term "a short wavelength tail region of a photoluminescence spectrum of a quantum dot" refers to a wavelength region of less than about 600 nm in a curve including a photoluminescence peak wavelength for a red light emitting quantum dot.

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

In an embodiment, a photosensitive composition includes
a plurality of quantum dots;
a color filter material including an absorption dye, an absorption pigment, or a combination thereof;
a polymer binder;
a photopolymerizable monomer having a carbon-carbon double bond;
a photoinitiator; and
a solvent
wherein in a normalized photoluminescence (PL) spectrum of the quantum dot and a normalized UV-visible absorption spectrum of the color filter material, a range of a photoluminescence peak wavelength of the quantum dot and a range of a wavelength of maximum absorbance of the color filter material do not overlap with each other, and the color filter material is included in an amount of less than or equal to 1 part by weight per 10 parts by weight of the plurality of quantum dots.

The quantum dot (hereinafter, referred to a semiconductor nanocrystal) is not particularly limited and may be a commercially available quantum dot. For example, the quantum dot may be a Group II-VI compound, a Group III-V compound, a Group IV-VI compound, a Group IV compound, a Group compound, a Group I-II-IV-VI compound or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. The Group compound may include CuInSe2, CuInS2, CuInGaSe, and CuInGaS but is not limited thereto. The Group IV compound may include CuZnSnSe, and CuZnSnS but is not limited thereto. The Group IV compound may include a single-element compound selected from Si, Ge, and a mixture thereof; and a binary element compound selected from SiC, SiGe, and a mixture thereof.

The binary element compound, the ternary element compound or the quaternary element compound respectively exist in a uniform concentration in the semiconductor nanocrystal particle or partially different concentrations in the same particle. In addition, the semiconductor nanocrystal may have a core-shell structure wherein a semiconductor nanocrystal surrounds another (different) semiconductor nanocrystal. The core and shell may have an interface, and an element of at least one of the core or the shell in the interface may have a concentration gradient wherein the concentration of the element(s) of the shell decreases toward the core. In addition, the semiconductor nanocrystal may have one core of a semiconductor nanocrystal and multi-shells surrounding the core. The core and multi-shell structure has at least two shells wherein each shell may be a single composition, an alloy, or the one having a concentration gradient.

In the semiconductor nanocrystal particle, the materials of the shell may have a larger energy bandgap than that of the core, and thereby the semiconductor nanocrystal may exhibit a quantum confinement effect more effectively. In case of a multi-shell type of semiconductor nanocrystal particle, the bandgap of the material of an outer shell may be higher energy than that of the material of an inner shell (a shell that is closer to the core). In this case, the semiconductor nanocrystal may emit light of a wavelength ranging from UV to infrared light.

The semiconductor nanocrystal may have quantum efficiency of greater than or equal to about 10%, greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color gamut ratio. The semiconductor nanocrystal may have a FWHM of less than or equal to about 45 nanometers (nm), for example less than or equal to about 40 nm, or less than or equal to about 30 nm. Within such ranges, a device including the nanocrystal may have enhanced color purity or improved color gamut ratio. The quantum dot may have a particle diameter (an average largest particle diameter for a non-spherical shape) of about 1 nm to about 100 nm. For example, the quantum dot may have a particle diameter (an average largest particle diameter for a non-spherical shape) of about 1 nm to about 20 nm, for example, about 2 nm to about 15 nm.

The shape of the quantum dot may have a generally-used shape in this art so is not particularly limited. For example, the quantum dot may have spherical, pyramidal, multi-armed, or cubic nanoparticles, nanotubes, nanowires, nanofibers, nanoplate particles, or the like.

The quantum dot may be commercially available or may be synthesized according to any method. For example, several nano-sized quantum dot may be synthesized according to a wet chemical process. In the wet chemical process, precursors react in an organic solvent to grow nanocrystal particles, and the organic solvent or a ligand compound may coordinate the surface of the semiconductor nanocrystal, controlling the growth of the nanocrystal. Examples of the organic solvent and ligand compound are known. The organic solvent coordinated on the surface of the quantum dot may affect stability of a device, and thus excess organic materials that are not coordinated on the surface of the quantum dot may be removed by pouring it in excessive non-solvent, and centrifuging the resulting mixture. Examples of the non-solvent may be acetone, ethanol, methanol, and the like, but are not limited thereto. After the removal of extra organic materials, the amount of the organic materials coordinated on the surface of the quantum dot may be less than or equal to about 50% by weight, for example, less than or equal to about 30 wt %. The organic material may include a ligand compound, an organic solvent, or a combination thereof.

The quantum dot has an organic ligand having a hydrophobic moiety bonded on the surface. In an embodiment, the organic ligand having a hydrophobic moiety may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein, R and R' are independently a C5 to C24 aliphatic hydrocarbon group, for example alkyl group or an alkenyl group, or a C5 to C20 aromatic hydrocarbon group, for example aryl group group), or a combination thereof.

Specific examples of the organic ligand compound on the surface of the quantum dot may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, or dipropyl amine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, or trioctylphosphine; phosphine compounds or oxide compounds thereof such as methyl phosphine oxide, ethyl phosphine oxide, propyl phosphine oxide, butyl phosphine oxide, pentyl phosphine oxide, octyl phosphine oxide, dioctyl phosphine oxide, or trioctylphosphine oxide; diphenyl phosphine, tri phenyl phosphine compound or oxide compounds thereof; C5 to C20 alkyl C5 to C20 alkyl phosphonic acid; and the like, but are not limited thereto. The quantum dot may include the hydrophobic organic ligand at alone or as a mixture of two or more.

An amount of the quantum dot (including the organic ligand as needed) may be greater than or equal to about 5 wt %, for example, greater than or equal to about 6 wt %, greater than or equal to about 8 wt %, greater than or equal to about 9 wt %, greater than or equal to about 10 wt % based on the total amount of the composition. The amount of the quantum dot including the organic ligand may be less than or equal to about 40 wt %, for example, less than or equal to about 39 wt %, less than or equal to about 35 wt %, less than or equal to about 30 wt %, less than or equal to about 25 wt %, or less than or equal to about 20 wt % based on the total amount of the composition.

Quantum dots have a lot of potential to be applied for an electronic device (e.g., various displays) requiring an improved color gamut ratio. For example, the conventional liquid crystal display (LCD) is a display expressing color by passing a polarized light, which is passed through liquid crystal, through an absorption color filter, but it unfavorably have a narrow viewing angle and a luminance deterioration due to the low transmittance of the absorptive color filter (e.g., about 33%). When the liquid crystal display employs a (not absorptive) photoluminescent color filter, it is anticipated to widen a viewing angle and to improve luminance.

When quantum dots are applied for the photoluminescent type color filter as a photoluminescent material, it is expected to improve the power efficiency and to enhance the color gamut ratio. This is because quantum dots may have a narrow (e.g., less than or equal to about 35 nm) full width at half maximum (FWHM) and a desirable (e.g., about 500 nm to about 650 nm) photoluminescence peak wavelength range by adjusting the composition, the particle size, and the particle size distribution in a chemical wet synthesizing process. However, most types of the quantum dot that may improve photoluminescence characteristics such as narrow full width at half maximum (FWHM) includes cadmium, which is one of the elements causing serious environmental problems.

Most of the cadmium-free quantum dots have a relatively wide distribution of the particle size and thus provide a wider full width at half maximum (FWHM) and a longer tail region (e.g., long wavelength tail region) that is out of the photoluminescence peak wavelength range in the photoluminescence spectrum.

A photosensitive composition according to the embodiment includes a predetermined amount of the color filter material including an absorption dye, an absorption pigment, or a combination thereof, and the color filter material has the wavelength range of the maximum absorbance that does not overlap with the range of the photoluminescence peak wavelength of the quantum dot so that it may suppress the photoluminescence of the quantum dot in the undesirable wavelength region in a photoluminescence spectrum. Therefore, the photosensitive composition of the embodiment may show improved color gamut ratio even though it includes a quantum dot (e.g. cadmium-free quantum dot) having a tail region in a photoluminescence spectrum.

For example, when the quantum dot is a green light emitting quantum dot, the range of a photoluminescence peak wavelength may be from about 500 nm to about 550 nm, and the color filter material may have the range of wavelength of maximum absorbance that is from about 570 nm to about 700 nm. However, it is not limited thereto. When the quantum dot is a red light emitting quantum dot, the range of a photoluminescence peak wavelength may be from about 600 nm to about 700 nm, and the color filter material may have a range of wavelength of maximum absorbance that is from about 650 nm to about 750 nm. However, it is not limited thereto.

In order to absorb a short wavelength region of the red light emitting quantum dot, the color filter material may have a range of a wavelength of maximum absorbance that is from about 470 nm to about 570 nm, but it is not limited thereto.

In order to suppress photoluminescence of the quantum dot in the undesirable wavelength region, the color filter material may show an absorption initiation wavelength within or before (e.g., in a shorter wavelength than a longer wavelength tail region) a longer wavelength tail region of the quantum dot.

For example, when the quantum dot is a green light emitting quantum dot, the quantum dot may have a longer wavelength tail region of about 570 nm to about 650 nm, and an absorption initiation wavelength of the color filter material may be greater than or equal to about 500 nm, for example, greater than or equal to about 530 nm, or greater than or equal to about 550 nm.

For example, when the quantum dot is a red light emitting quantum dot, the quantum dot may have a longer wavelength tail region of about 650 nm to about 700 nm, and an absorption initiation wavelength of the color filter material may be greater than or equal to about 600 nm, for example, greater than or equal to about 630 nm or greater than or equal to about 650 nm.

In an embodiment, the color filter material may show an absorption initiation wavelength within or after (e.g., in a longer wavelength than the shorter wavelength tail region) a shorter wavelength tail region of the quantum dot in a normalized photoluminescence spectrum of the quantum dot and a normalized UV-visible absorption spectrum of the color filter material.

For example, when the quantum dot is a red light emitting quantum dot, the quantum dot may have a shorter wavelength tail region of about 550 nm to about 600 nm, and an absorption termination wavelength of the color filter material may be less than or equal to about 600 nm (e.g., less than or equal to about 590 nm or less than or equal to about 580 nm) or less than or equal to about 610 nm.

The color filter material may be an absorption dye, an absorption pigment, or a combination thereof. Types of the absorption dye or pigment are not particularly limited and may be appropriately selected. For example, the absorption dye and absorption pigment may be an organic dye that is an organometallic complex, a coumarin compound, a rhodamine compound, a phenoxazone compound, a stilbene compound, a terphenyl compound, a quaterphenyl compound, a perylene compound, a diketopyrrolopyrrole compound, a squaraine dye such as (E)-4-((5-carboxy-3,3-dimethyl-1-octyl-3H-indolium-2-yl)methylene)-2-((E)-(3-ethyl-1,1-dimethyl-1H-benzo[e]indol-(3H)-ylidene)methyl)-3-oxocyclobut-1-enolate (CAS NO. 1240041-84-2, SQ02), a phthalocyanine compound such as vanadyl phthalocyanine (VOPc), an anthraquinone compound, or a combination thereof. The absorption dye or pigment may be synthesized according to a known method or may be commercially available.

The color filter material may be included in an amount of less than or equal to about 10 part by weight, for example, less than or equal to about 9 parts by weight, less than or equal to about 8 parts by weight, less than or equal to about 7 parts by weight, less than or equal to about 6 parts by weight, less than or equal to about 5 parts by weight, less than or equal to about 4 parts by weight, less than or equal to about 3 parts by weight, less than or equal to about 2 parts by weight, less than or equal to about 1 part by weight, less than or equal to about 0.5 parts by weight, less than or equal to about 0.1 part by weight, less than or equal to about 0.09 parts by weight, less than or equal to about 0.08 parts by weight, less than or equal to about 0.07 parts by weight, less than or equal to about 0.06 parts by weight, less than or equal to about 0.05 parts by weight, less than or equal to about 0.04 parts by weight, less than or equal to about 0.03 parts by weight, less than or equal to about 0.02 parts by weight, less than or equal to about 0.01 part by weight, less than or equal to about 0.009 parts by weight, less than or equal to about 0.008 parts by weight, less than or equal to about 0.007 parts by weight, less than or equal to about 0.006 parts by weight, less than or equal to about 0.005 parts by weight, less than or equal to about 0.004 parts by weight, less than or equal to about 0.003 parts by weight, less than or equal to about 0.002 parts by weight, less than or equal to about 0.001 parts by weight per 100 parts by weight of the plurality of quantum dots. The amount of the color filter material may be selected considering the factors such as photoluminescence peak wavelength range of the quantum dot, the absorption initiation wavelength of the color filter material, and/or the maximum absorption wavelength.

The photosensitive composition according to an embodiment may include a polymer binder. The polymer binder may be a carboxyl group (—COOH) containing binder, and the polymer binder may contribute to alkali developability of the prepared composition and may promote the dispersibility of the plurality of quantum dots in the composition. For example, the plurality of quantum dots may be dispersed (e.g., separated from each other) by the polymer binder.

In order for the quantum dots to be dispersed efficiently, the polymer binder may have acid value of greater than or equal to about 50 milligrams of potassium hydroxide per gram of the polymer binder (mg KOH/g), which may vary with the structure of the polymer binder (e.g., the chemical structure of the main chain or the side chain of the binder). For example, the polymer binder may have an acid value of greater than or equal to about 55 mg KOH/g, greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The acid value of the polymer binder may be, for example, less than or equal to about 200 mg KOH/g, for example, less than or equal to about 190 mg KOH/g, or less than or equal to about 180 mg KOH/g, but is not limited thereto.

When the quantum dots are mixed a binder-containing solution having an acid value within the ranges, they may form a quantum dot-binder dispersion, which may show improved compatibility with other components of a photoresist (e.g., a photopolymerizable monomer, a photoinitiator, a solvent, and the like that will be described later) and thereby allow the quantum dots to be dispersed in a resulting composition (i.e., photoresist composition) to the extent that the composition may form a pattern. In some embodiments, therefore, the plurality of quantum dots may be dispersed (for example, separated from one another) by the carboxylic acid group (—COOH)-containing polymer to form a quantum dot dispersion. The quantum dot dispersion includes the carboxylic acid group (—COOH)-containing polymer and the plurality of quantum dots dispersed in the carboxylic acid group (—COOH)-containing polymer. The quantum dot dispersion may further include a solvent.

The polymer binder (e.g., the carboxyl group-containing polymer) may be a copolymer of a monomer mixture including a first monomer having a carboxyl group and a carbon-carbon double bond and a second monomer having a carbon-carbon double bond and a hydrophobic moiety and not having a carboxyl group. The first monomer forms a first repeating unit in the polymer binder, and the second monomer forms a second repeating unit in the polymer binder. The polymer binder (e.g., the carboxyl group-containing polymer) may be a copolymer of a monomer mixture that further includes a third monomer having a carbon-carbon double bond and a hydrophilic moiety and not having a carboxyl group. The third monomer forms a third repeating unit in the polymer binder.

Examples of the first monomer may include acrylic acid, methacrylic acid, maleic acid, itaconic acid, fumaric acid, 3-butanoic acid, and carbonic acid vinyl ester compounds such as vinyl acetate, and vinyl benzoate, but are not limited thereto. The first monomer may include one or more compounds.

Examples of the second monomer may be alkenyl aromatic compounds such as styrene, α-methyl styrene, vinyl toluene, or vinyl benzyl methyl ether; unsaturated carbonic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carbonic acid amino alkyl ester compounds such as 2-aminoethyl acrylate, 2-aminoethyl methacrylate, 2-dimethylamino ethyl acrylate, N-phenylmaleimide, N-benzylmaleimide, N-alkylmaleimide, or 2-dimethyl amino ethyl methacrylate; unsaturated carbonic acid glycidyl ester compounds such as glycidyl acrylate, or glycidyl methacrylate; vinyl cyanide compounds such as acrylonitrile, or methacrylonitrile; unsaturated amide compounds such as acrylamide and methacrylamide, but are not limited thereto. The second monomer may include one or more compounds.

Examples of the third monomer may include 2-hydroxy ethyl acrylate, 2-hydroxyethyl methacrylate, 2-hydroxybutyl acrylate, 2-hydroxybutyl methacrylate, 2-aminoethyl acrylate, and 2-aminoethyl methacrylate, but are not limited thereto. The third monomer may include one or more compounds.

In the carboxyl group-containing binder, the amount of the first repeating unit may be greater than or equal to about 10 mol %, for example, greater than or equal to about 15 mol %, greater than or equal to about 25 mol %, or greater than or equal to about 35 mol %. In the carboxyl group-containing binder, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxyl group-containing binder, an amount of the second repeating unit may be greater than or equal to about 10 mol %, for example, may be greater than or equal to about 15 mol %, may be greater than or equal to about 25 mol %, or may be greater than or equal to about 35 mol %. In the carboxyl group-containing binder, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In the carboxyl group-containing binder, an amount of the third repeating unit may be greater than or equal to about 1 mol %, for example, greater than or equal to about 5 mol %, greater than or equal to about 10 mol %, or greater than or equal to about 15 mol %. In the carboxyl group-containing binder, an amount of the third repeating unit may be less than or equal to about 20 mol %, for example, less than or equal to about 15 mol %, or less than or equal to about 10 mol %.

The carboxyl group-containing binder may a copolymer of (meth)acrylic acid; and at least one second monomer selected from arylalkyl(meth)acrylate, hydroxyalkyl (meth)acrylate, and styrene. For example, the carboxyl group-containing binder may a methacrylic acid/methyl methacrylate copolymer, a methacrylic acid/benzyl methacrylate copolymer, methacrylic acid/benzyl methacrylate/styrene copolymer, a methacrylic acid/benzyl methacrylate/2-hydroxyethyl methacrylate copolymer, or a methacrylic acid/benzyl methacrylate/styrene/2-hydroxyethyl methacrylate copolymer.

The carboxyl group-containing binder may have a molecular weight of greater than or equal to about 1000 grams per mole (g/mol), for example, greater than or equal to about 2000 g/mol, greater than or equal to about 3000 g/mol, or greater than or equal to about 5000 g/mol. The carboxyl group-containing binder may have a molecular weight of less than or equal to about 100,000 g/mol, for example, less than or equal to about 50,000 g/mol. Within the ranges, developability may be ensured.

In the photosensitive composition, an amount of the carboxyl group-containing binder may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt % based on the total weight of the composition. An amount of the carboxyl group-containing binder may be less than or equal to about 30 wt %, for example, less than or equal to about 29 wt %, less than or equal to about 28 wt %, less than or equal to about 27 wt %, less than or equal to about 26 wt %, less than or equal to about 25 wt %, less than or equal to about 20 wt % or less than or equal to about 15 wt % based on the total weight of the composition.

A photosensitive composition according to an embodiment includes a photopolymerizable monomer having a carbon-carbon double bond. The photopolymerizable monomer may be any monomer having a carbon-carbon double bond and being polymerizable by light and is not particularly limited thereto. For example, the photopolymerizable monomer may be a vinyl monomer, an unsaturated ethylene oligomer, a homopolymer thereof, or a copolymer of the unsaturated ethylene oligomer and an ethylenically unsaturated monomer. Examples of the photopolymerizable monomer may be ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, trimethylolpropane tri(meth)acrylate, novolac epoxy (meth)acrylate, diethylene glycol di(meth)acrylate, triethylene glycol dimethacrylate, or propylene glycol di(meth)acrylate, but are not limited thereto. In an embodiment, the photopolymerizable monomer may be a di(meth)acrylate compound, a tri(meth)acrylate compound, a tetra(meth)acrylate compound, a penta(meth)acrylate compound, a hexa(meth)acrylate compound, or a combination thereof.

In the photosensitive composition, an amount of the photopolymerizable monomer may be greater than or equal to about 0.5 wt %, for example, greater than or equal to about 1 wt %, greater than or equal to about 2 wt %, greater than or equal to about 5 wt %, or greater than or equal to about 10 wt % based on the total weight of the composition. The amount of the photopolymerizable monomer may be less than or equal to about 20 wt %, for example, less than or equal to about 19 wt %, less than or equal to about 18 wt %, less than or equal to about 15 wt %, or less than or equal to about 10 wt % based on the total weight of the composition.

The photosensitive composition includes a photoinitiator. The particular photoinitiator used is not critical, and can be selected appropriately by one of ordinary skill in the art. For example, the available photoinitiator may include a triazine compound, an acetophenone compound, a benzophenone compound, a thioxanthone compound, a benzoin compound, an oxime compound, or a combination thereof, but are not limited thereto.

Examples of the triazine compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis (trichloro methyl)-6-styryl-s-triazine, 2-(naphthol-yl)-4,6-bis(trichloro methyl)-s-triazine, 2-(4-methoxy naphthol-yl)-4,6-bis(trichloro methyl)-s-triazine, 2,4-trichloro methyl (piperonyl)-6-triazine, and 2,4-(trichloro methyl (4'-methoxy styryl)-6-triazine, but are not limited thereto.

Examples of the acetophenone compound may be 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, but are not limited thereto.

Examples of the benzophenone compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, but are not limited thereto.

Examples of the thioxanthone compound may be thioxanthone, 2-methyl thioxanthone, isopropyl thioxanthone, 2,4-diethyl thioxanthone, 2,4-diisopropyl thioxanthone, 2-chloro thioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, but are not limited thereto.

The photoinitiator may be also a carbazole compound, a diketone compound, a sulfonium borate compound, a diazo compound, a biimidazole compound, and the like, in addition to the photoinitiators.

In the photosensitive composition, the amount of the photoinitiator may be greater than or equal to about 0.01 wt %, for example, greater than or equal to about 0.05 wt %, greater than or equal to about 0.1 wt %, greater than or equal to about 0.5 wt %, greater than or equal to about 1 wt %, greater than or equal to about 2 wt %, or greater than or equal to about 3 wt % based on the total weight of the composition. The amount of the photoinitiator may be less than or equal to about 10 wt %, for example, less than or equal to about 9 wt %, less than or equal to about 8 wt %, less than or equal to about 7 wt %, less than or equal to about 6 wt % or less than or equal to about 5 wt % based on the total weight of the composition. Within the aforementioned ranges, a photosensitive composition having an exposure margin may be prepared.

In some embodiments, the photosensitive composition may further include various additives such as a light diffusing agent, a leveling agent, or a coupling agent in addition to the above components, if desired. The amount of the additive is not particularly limited but may be appropriately controlled within the range where it does not cause adverse effect on the photosensitive composition and the pattern obtained therefrom.

The light diffusing agent may increase a refractive index of composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and Examples may include the following but are not limited thereto.

A fluorine leveling agent may include commercial products, for example BM-1000®, and BM-1100® (BM Chemie Inc.); MEGAFACE F 142D®, F 172®, F 173®, and F 183® (Dainippon Ink Kagaku Kogyo Co., Ltd.); FC-135®, FC-170C®, FC-430 and FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032 and SF-8428®, and the like (Toray Silicone Co., Ltd.). Types and amounts of the additive may be adjusted as needed.

The coupling agent is selected to increase adherence between a pattern and glass, and examples thereof may include a silane coupling agent. Examples of the silane coupling agent may be vinyl trimethoxysilane, vinyl tris (2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

The photosensitive composition includes a solvent. An amount of the solvent may be determined considering the amounts of the above main components (i.e., the quantum dot, the COOH group-containing binder, the photopolymerizable monomer, and the photoinitiator), and the additives. The composition may include a balance amount of the solvent and amounts of the desirable solids (non-volatiles). The solvent may be appropriately selected considering the dissolution of the initiator and the processibility of the photosensitive composition. Examples of the solvent may be ethylene glycols such as ethyl 3-ethoxy propionate, ethylene glycol, diethylene glycol, polyethylene glycol, and a mixture thereof; glycol ethers such as ethylene glycol monomethyl ether, ethylene glycol monoethyl ether, diethylene glycol monomethyl ether, ethylene glycol diethyl ether, diethylene glycol dimethyl ether, and a mixture thereof; glycol ether acetates such as ethylene glycol acetate, ethylene glycol monoethyl ether acetate, diethylene glycol monoethyl ether acetate, diethylene glycol monobutyl ether acetate, and a mixture thereof; propylene glycols such as propylene glycol; propylene glycol ethers such as propylene glycol monomethyl ether, propylene glycol monoethyl ether, propylene glycol monopropyl ether, propylene glycol monobutyl ether, propylene glycol dimethylether, dipropylene glycol dimethyl ether, propylene glycol diethyl ether, dipropylene glycol diethyl ether, and a mixture thereof; propylene glycol ether acetates such as propylene glycol monomethyl ether acetate, dipropylene glycol monoethyl ether acetate, and a mixture thereof; amides such as N-methylpyrrolidone, dimethyl formamide, dimethyl acetamide, and a mixture thereof; ketones such as methylethylketone (MEK), methylisobutylketone (MIBK), cyclohexanone, and a mixture thereof; petroleum solvents such as toluene, xylene, naphtha, and a mixture thereof; and esters such as ethyl acetate, butyl acetate, ethyl lactate, and a mixture thereof.

A method of preparing a photosensitive composition according to the embodiment includes preparing a binder solution including the polymer binder and the solvent;

dispersing a plurality of quantum dots (e.g., that include an organic ligand having a hydrophobic moiety on a surface thereof) and the color filter material in the binder solution to obtain a dispersion of the quantum dots, the color filter material, and the binder (hereinafter, a QD-CF-Binder dispersion); and mixing the QD-CF-Binder dispersion with at least one of the photopolymerizable monomer, the photoinitiator, and the solvent. A mixing method is not particularly limited and may be appropriately adopted. For example, each component may be mixed sequentially or simultaneously.

The preparation method may further include selecting a quantum dot (e.g., that includes an organic ligand having a hydrophobic moiety on the surface), and selecting a binder capable of dispersing the selected quantum dot. In the step of selecting the binder, the binder may be the same as described above, and a chemical structure and an acid value of a polymer of the polymer binder may be considered.

Details of the quantum dot, the color filter material, binder, the photopolymerizable monomer, and the photoinitiator are the same as set forth above.

The photosensitive composition may be developed using an alkali aqueous solution to form a quantum dot-polymer composite pattern. In an exemplary embodiment, when the aforementioned photosensitive composition is used, a quantum dot-polymer composite pattern may be formed without using an organic solvent developing solution.

A non-limiting method of forming a pattern is explained referring to FIG. 1.

First, the photosensitive composition is coated on a predetermined substrate (e.g., a glass substrate or a glass substrate coated with a predetermined thickness of SiNx (protective layer) (e.g., about 500 Å to about 1500 Å of the protective layer)) in an appropriate manner such as a spin coating, a slit coating and the like to form a film of a predetermined thickness (e.g., thickness of about 3.0 μm to about 10 μm). The formed film may be pre-baked, if desired. The specific conditions of pre-baking such as a temperature, a time, and an atmosphere are known in the art and may be selected appropriately.

The formed (or, optionally pre-baked) film is exposed to light of a predetermined wavelength under a mask having a predetermined pattern. The wavelength and the intensity of light may be selected considering the types and the amounts of photoinitiator, and the types and the amounts of quantum dot or the like.

The exposed film is treated with an alkali developing solution, and thereby the unexposed region in the film is dissolved to provide a desirable pattern. The obtained pattern may be post-baked to improve the crack resistance and the solvent-resistance thereof.

In order to use the quantum dot-polymer composite obtained from the photosensitive composition as a color filter, at least two types of photosensitive compositions, each of which emits light of a desired color, (e.g., two types of photosensitive composition including red-light emitting quantum dots and green-light emitting quantum dots, respectively) are prepared; the pattern forming process is repeated for each composition to provide a quantum dot-polymer composite having a desirable pattern.

Accordingly, another embodiment provides a pattern of the quantum dot-polymer composite. The quantum dot, the binder, and the photopolymerizable monomer are the same as described above.

Hereinafter, the embodiments are illustrated in more detail with reference to examples. However, they are exemplary embodiments of the present invention, and the present invention is not limited thereto.

EXAMPLES

Measurement Method
Photoluminescence Spectrophotometry
Photoluminescence spectrometer (Manufacturer: Hitachi, Model: F-7000), photo-radiation wavelength: 450 nm
UV-Visible Absorption Spectroscopy
UV-Visible absorption spectrometer (Manufacturer: Agilent, Model: Cary 5000).
Color Coordinate (Cx, Cy) and (NTSC, Adobe, DCI) Color Gamut Ratio
Obtained films or solutions (8 cm×8 cm) are analyzed using a spectroradiometer (CS-2000, Konica Minolta) on a blue light source (using a 60 inch TV panel) to obtain color coordinates, and (NTSC, Adobe, DCI) color gamut ratios.

Reference Example 1: Preparation of Green Light Emitting Quantum Dot (MQD)

0.2 millimoles (mmol) of indium acetate, 0.6 mmol of palmitic acid, and 10 milliliters (mL) of 1-octadecene are placed into a reactor and heated under vacuum at 120° C. After 1 hour, the atmosphere in the reactor is substituted with nitrogen. After the resultant is heated at 280° C., a mixed solution including 0.1 mmol of tris(trimethylsilyl) phosphine (TMS3P) and 0.5 mL of trioctylphosphine is injected thereto and reacted for 20 minutes. The reaction mixture is then cooled and acetone is added thereto to produce precipitates (InP quantum dot), which are then separated by centrifugation and dispersed in toluene.

0.3 mmol (0.056 g) of zinc acetate, 0.6 mmol (0.189 g) of oleic acid, and 10 mL of trioctylamine are placed in a flask, subjected to a vacuum state at 120° C. for 10 minutes. Then the resultant is heated at 220° C. after the atmosphere in the flask is substituted with $N_2$. Then, a toluene dispersion of the InP core nanocrystals thus prepared (optical density: 0.15) and 0.6 mmol of S/TOP (e.g., sulfur dissolved/dispersed in trioctylphosphine) are added to the flask and the resulting mixture is heated at 280° C., and the reaction proceeds for about 30 minutes. After the reaction is complete, the reaction solution is cooled to room temperature to obtain a reaction mixture including InP/ZnS semiconductor nanocrystals.

(2) An amount of ethanol is added to the reaction mixture including the InP/ZnS semiconductor nanocrystals, which is then subjected to centrifugation to remove excess organic material on the surface of the nanocrystals. After centrifugation, the supernatant is discarded and precipitates are dissolved in hexane. An amount of ethanol is added and centrifuged to obtain an InP/ZnS semiconductor nanocrystal (MQD).

The obtained InP/ZnS semiconductor nanocrystal (MQD) is dried and dispersed in chloroform. Then, a photoluminescence spectrum is measured and the results are illustrated in FIG. 2.

From the results of FIG. 2, the InP/ZnS semiconductor nanocrystal may have a photoluminescence peak range of about 515 nm to about 530 nm, and a longer wavelength tail region of about 570 nm to about 650 nm from photoluminescence spectrophotometry.

Reference Example 2: Preparation of Green Light Emitting Quantum Dot (HQD) II

An InP/ZnS semiconductor nanocrystal (HQD) is obtained in accordance with the same procedure as in Reference Example 1, except that the reaction time is increased from about 20 minutes to about 30 minutes.

The obtained InP/ZnS semiconductor nanocrystal (HQD) is dried and dispersed in chloroform and then measured for a photoluminescence spectrum. The results are shown in FIG. 2.

From the results of FIG. 2, the InP/ZnS semiconductor nanocrystal (HQD) may have a photoluminescence peak range of about 525 nm to about 540 nm, and a longer wavelength tail region of about 570 nm to about 650 nm from photoluminescence spectrophotometry.

Reference Example 3: UV-Visible Absorption Spectroscopy Analysis of Absorption Pigment SQ02 and VOPc An UV-Visible absorption spectrum analysis is performed for an SQ02 dye and a VOPc dye, each having one of the following chemical structures, and the results are shown in FIG. 2.

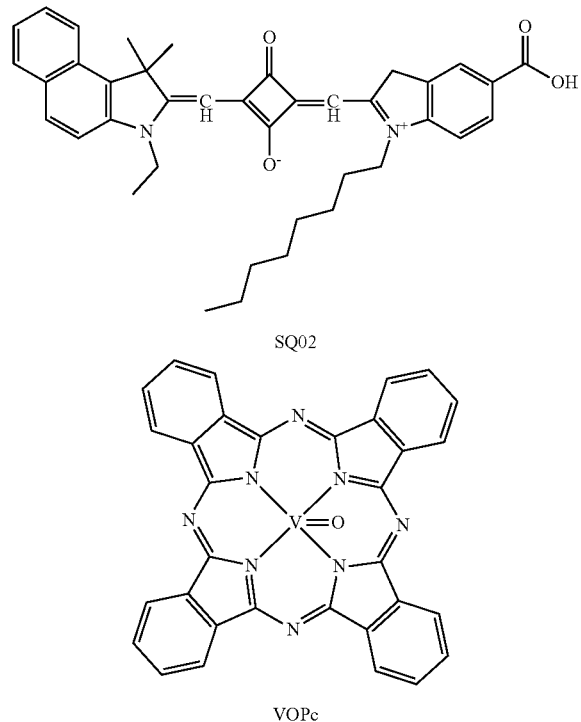

SQ02

VOPc

From FIG. 2, it is confirmed that SQ02 dye has a wavelength of maximum absorbance range of about 650 nm to about 670 nm and an absorption initiation wavelength of about 550 nm; VOPc dye has a wavelength of maximum absorbance range of about 680 nm to about 700 nm and an absorption initiation wavelength of about 570 nm.

Example 1-1

Figure 3A:
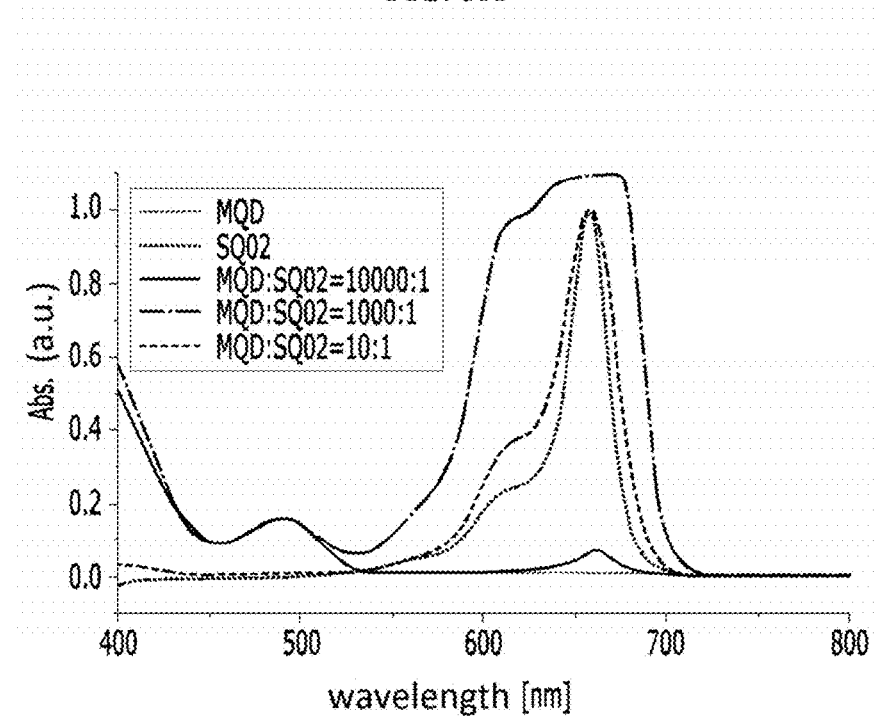
FIG. 3A is a graph of absorbance (a.u.) versus wavelength (nm) and shows a UV-vis absorption spectrum of quantum dots, absorption dyes, and mixtures thereof in Example 1-1.
Figure 3B:
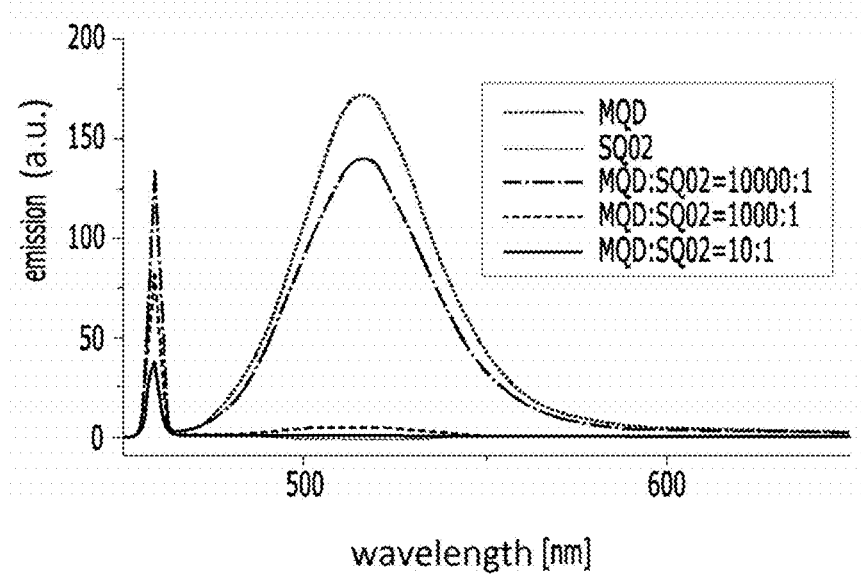
FIG. 3B is a graph of emission (a.u.) versus wavelength (nm) and shows a photoluminescence spectrum of quantum dots, absorption dyes, and mixtures thereof in Example 1-1.
Figure 3C:
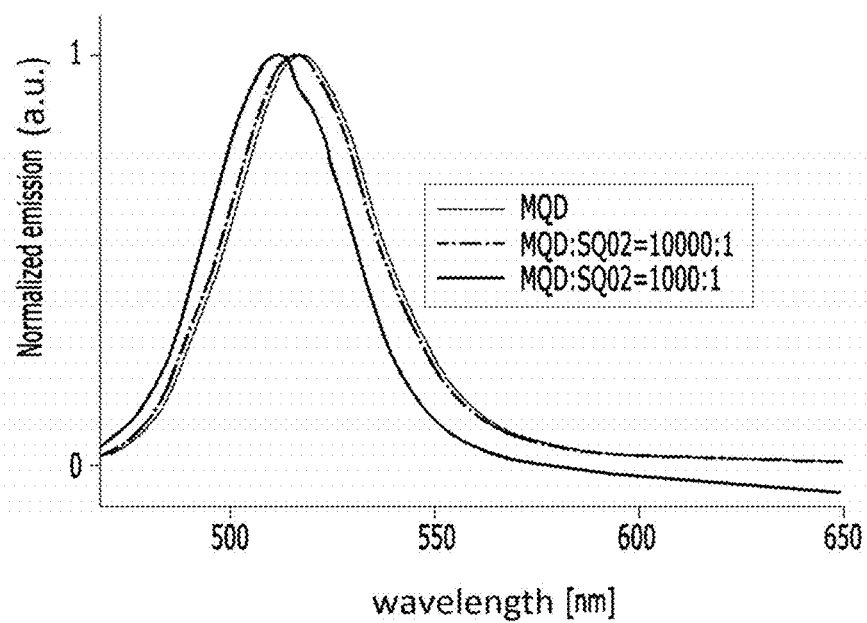
FIG. 3C is a graph of normalized emission (a.u.) versus wavelength (nm) and shows photoluminescence spectra of quantum dots, absorption dyes, and mixtures thereof in Example 1-1.

FIG. 3A, FIG. 3B, and FIG. 3C show the results of UV-Visible absorption spectroscopy analysis and photoluminescence spectroscopy analysis of the mixtures in which MQD and SQ02 dye obtained from Reference Example 1 are mixed at a predetermined ratio (MQD:SQ02=10000:1, 1000:1, and 10:1).

FIG. 3A is a UV-Visible absorption spectrum and confirms that as the amount ratio of the SQ02 dye decreases, the absorption at the wavelength corresponding to the long wavelength tail region is also decreased.

FIG. 3B is a photoluminescence (PL) spectrum and confirms that the photoluminescence is decreased by adding SQ02 dye in an amount of about 1/1000 with respect to the amount of the QD.

FIG. 3C confirms that the long wavelength tail region of MQD is decreased by adding the SQ02 dye. FIG. 3C is a graph obtained by the normalization of FIG. 3B, wherein the absorption intensity at each value of the wavelength is divided by the maximum intensity at a wavelength showing the greatest absorption.

FIG. 7 shows the results of a color coordinate analysis for each of the mixtures (i.e. the solutions) obtained by mixing the MQD of Reference Example 1 with the SQ02 dye at a predetermined ratio (MQD:SQ02=10000:1 and 1000:1).

The results of FIG. 7 confirm that the color coordinate area may be increased by mixing quantum dots with the dye, and such an increase may lead to the improvement of color gamut ratio.

Example 1-2

Figure 4A:
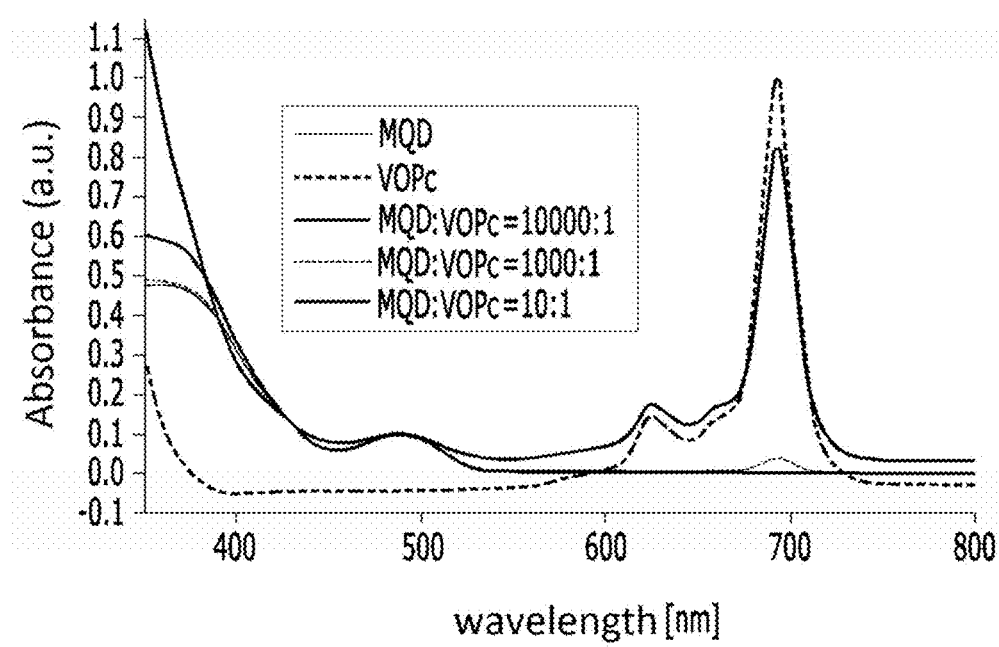
FIG. 4A is a graph of absorbance (a.u.) versus wavelength (nm) and shows UV-vis absorption spectra of quantum dots, absorption dyes, and mixture s thereof in Example 1-2.
Figure 4B:
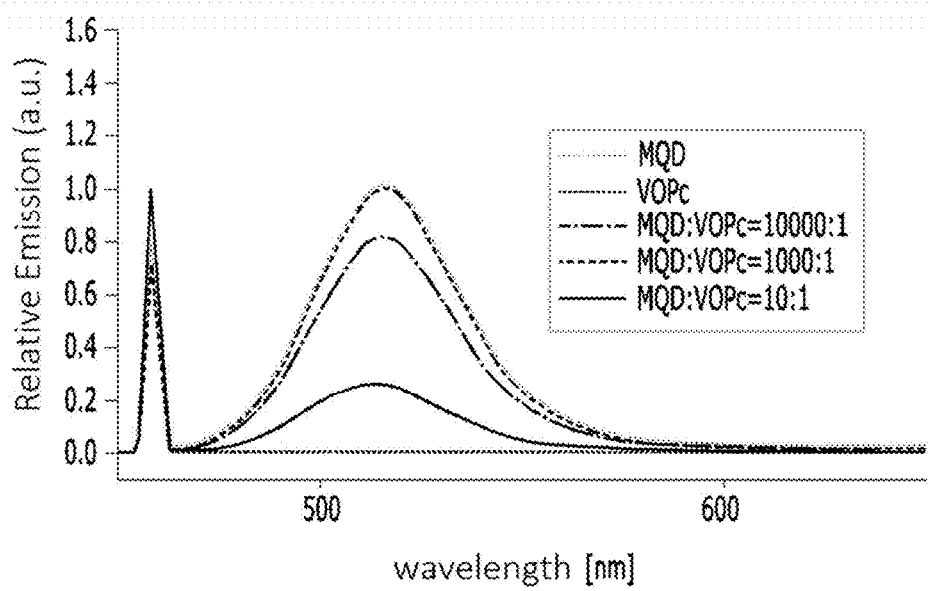
FIG. 4B is a graph of relative emission (a.u.) versus wavelength (nm) and shows photoluminescence spectra of quantum dots, absorption dyes, and mixtures thereof in Example 1-2.
Figure 4C:
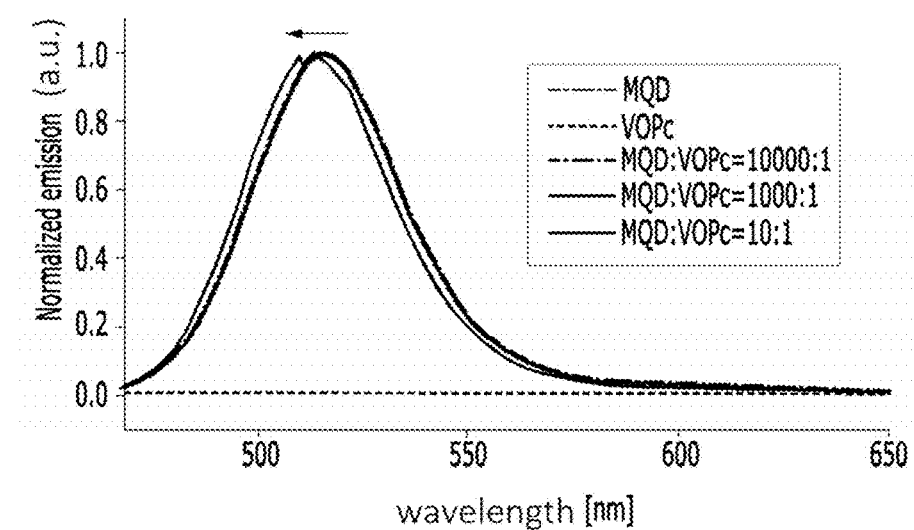
FIG. 4C is a graph of normalized emission (a.u.) versus wavelength (nm) and shows photoluminescence spectra of quantum dots, absorption dyes, and mixtures thereof in Example 1-2.

FIGS. 4A, 4B, and 4C show the results of UV-Visible absorption spectroscopy analysis and photoluminescence spectroscopy analysis of the mixtures in which MQD and VOPc dye obtained from Reference Example 1 are mixed at a predetermined ratio (MQD:VOPc=10000:1, 1000:1 and 10:1).

Example 1-3

Figure 5A:
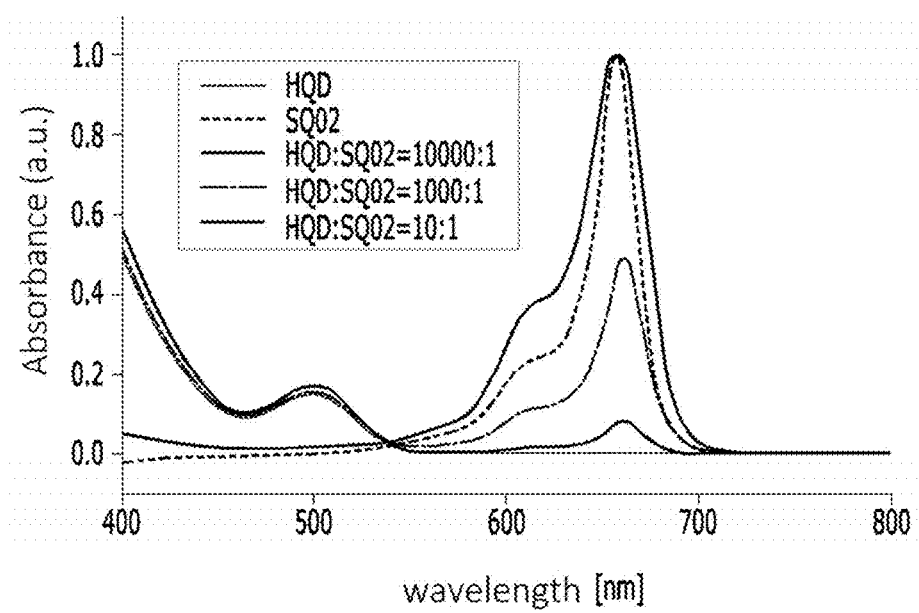
FIG. 5A is a graph of absorbance (a.u.) versus wavelength (nm) and shows UV-vis absorption spectra of quantum dots, absorption dyes, and mixtures thereof in Example 1-3.
Figure 5B:
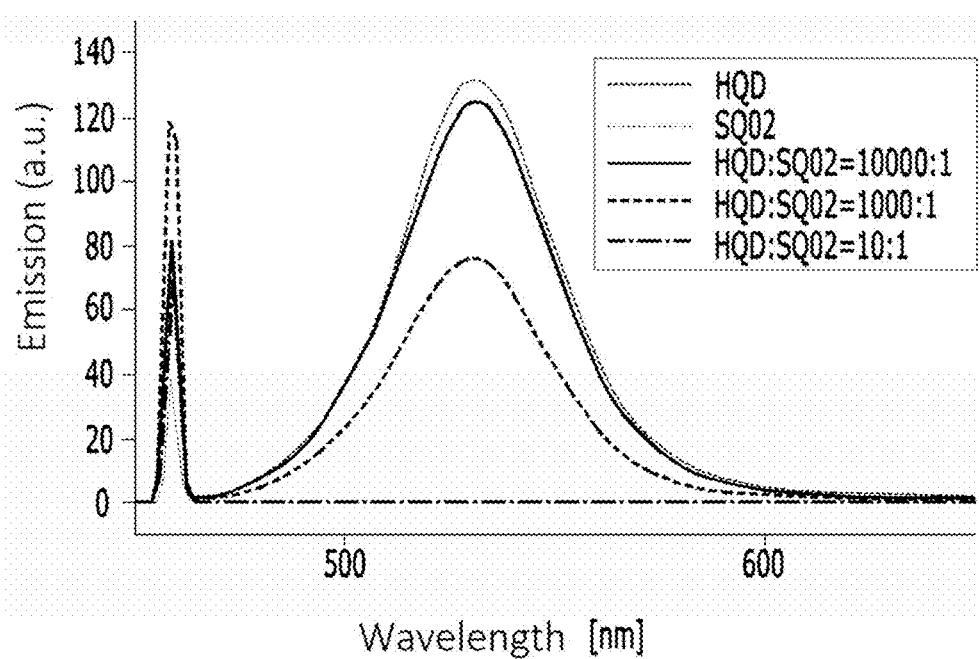
FIG. 5B is a graph of emission (a.u.) versus wavelength (nm) and shows photoluminescence spectra of quantum dots, absorption dyes, and mixtures thereof in Example 1-3.
Figure 5C:
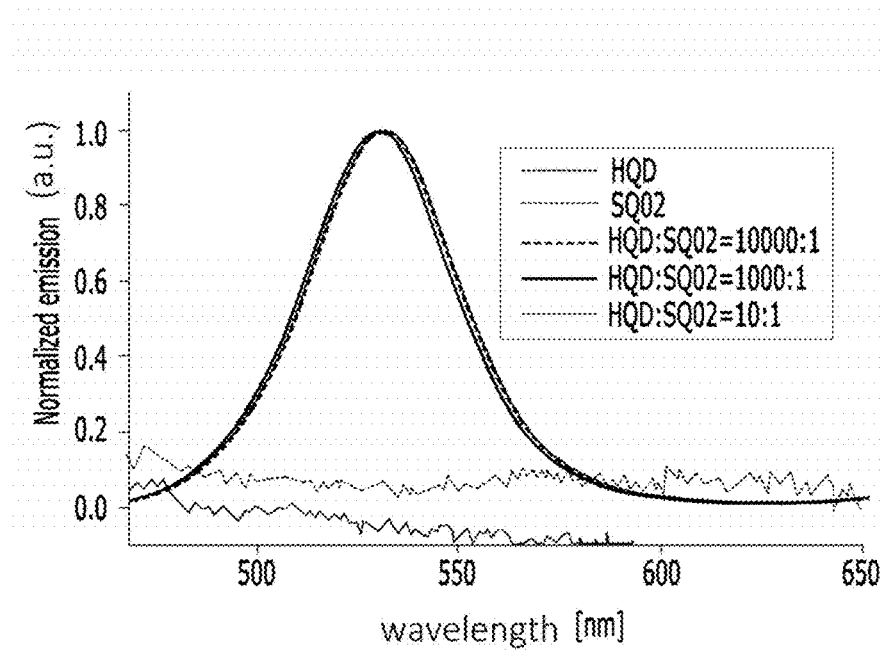
FIG. 5C is a graph of normalized emission (a.u.) versus wavelength (nm) and shows photoluminescence spectra of quantum dots, absorption dyes, and mixtures thereof in Example 1-3.

FIGS. 5A, 5B, and 5C show the results of UV-Visible absorption spectroscopy analysis and photoluminescence spectroscopy analysis of the mixtures in which the HQD of Reference Example 2 and the SQ02 dye are mixed at a predetermined ratio (HQD:SQ02=10000:1, 1000:1 and 10:1).

Example 1-4

Figure 6A:
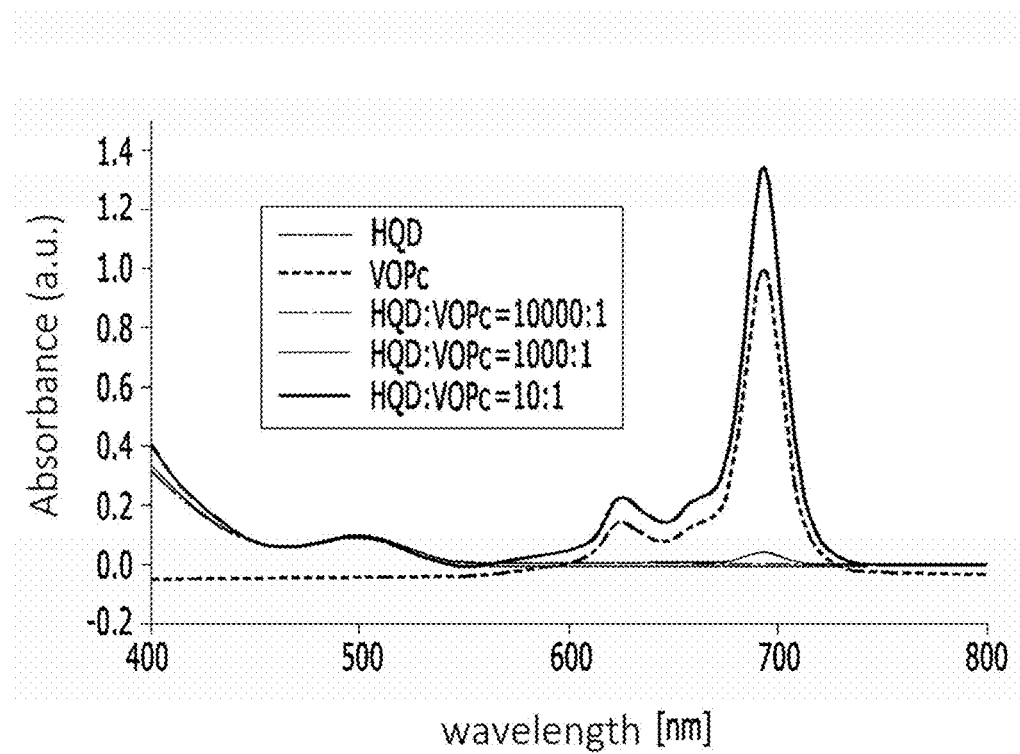
FIG. 6A is a graph of absorbance (a.u.) versus wavelength (nm) and shows UV-vis absorption spectra of quantum dots, absorption dyes, and mixtures thereof in Example 1-4.
Figure 6B:
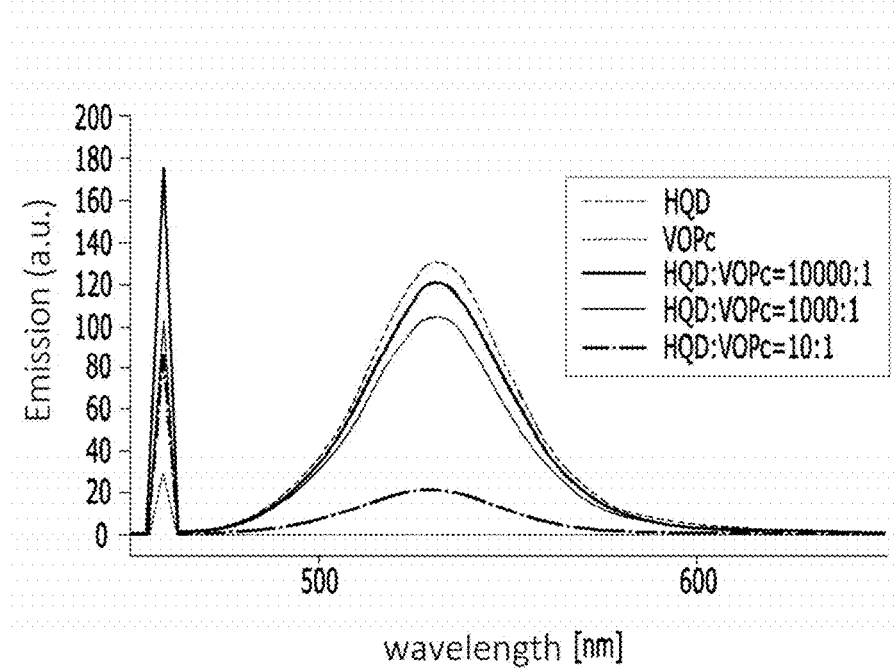
FIG. 6B is a graph of emission (a.u.) versus wavelength (nm) and shows photoluminescence spectra of quantum dots, absorption dyes, and mixtures thereof in Example 1-4.
Figure 6C:
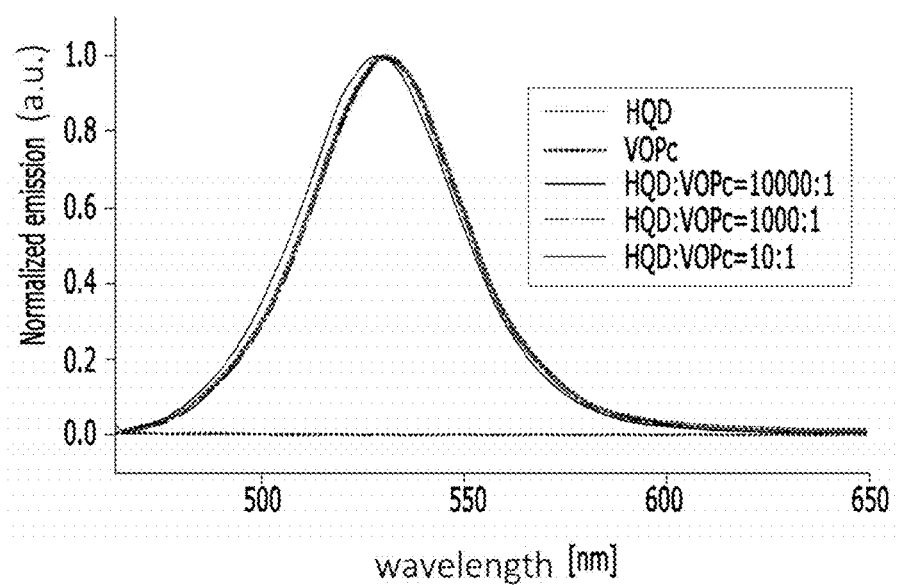
FIG. 6C is a graph of normalized emission (a.u.) versus wavelength (nm) and shows photoluminescence spectra of quantum dots, absorption dyes, and mixtures thereof in Example 1-4.
Figure 8C:
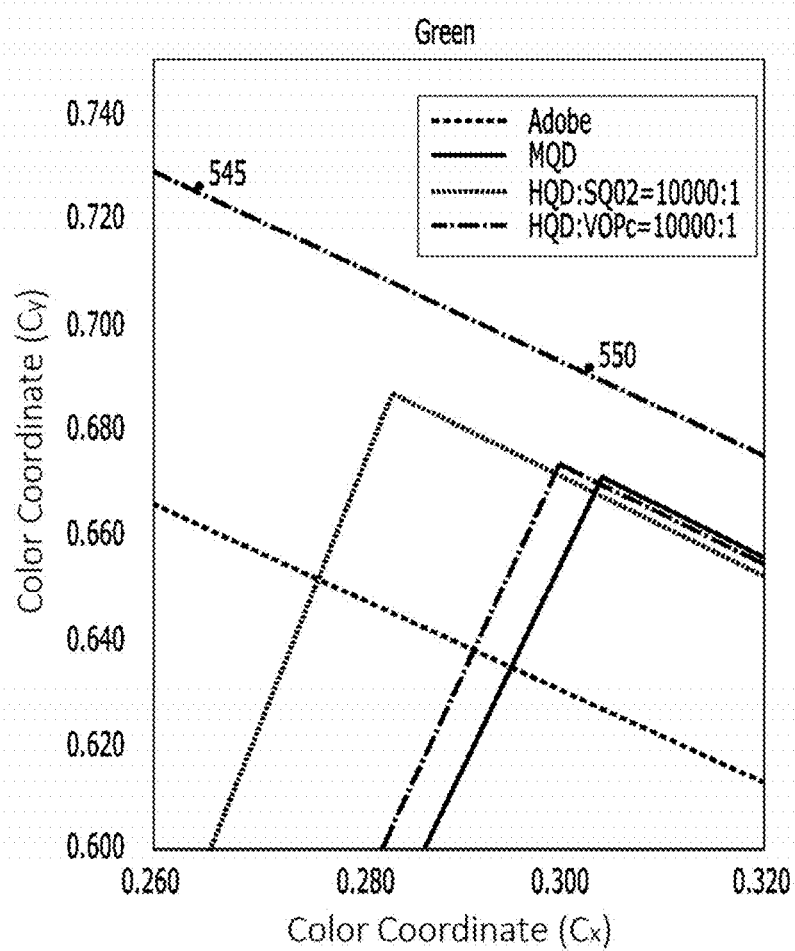
Figure 8D:
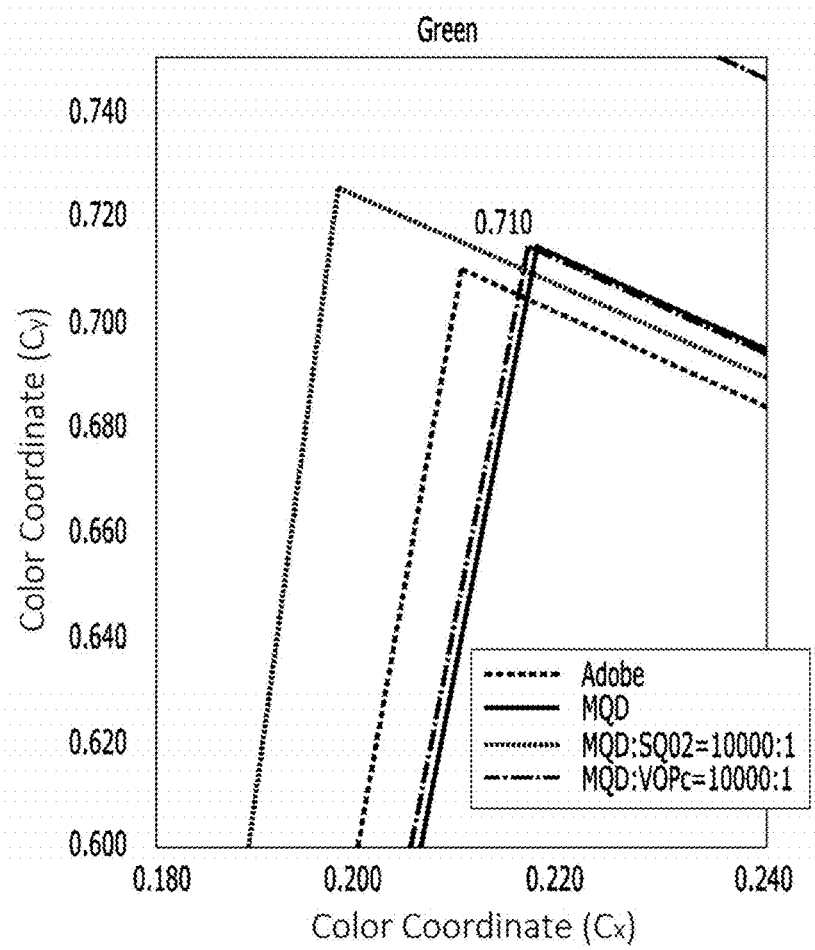

FIGS. 6A, 6B and 6C show the results of UV-Visible absorption spectroscopy analysis and photoluminescence spectroscopy analysis of the mixtures in which the HQD of Reference Example 2 and the SQ02 dye are mixed at a predetermined ratio (HQD:SQ02=10000:1, 1000:1, and 10:1).

Example 1-5

From photoluminescence spectrum for each of the mixed solutions obtained from Example 1-1 to Example 1-4, a photoluminescence peak wavelength and a full width at half maximum (FWHM) for each solution are measured, and the results are compiled in the following Table 1:

TABLE 1

|   | Mixing ratio (weight reference) | Photoluminescence peak wavelength (nm) | FWHM (nm) |
|---|---|---|---|
| Reference Example 1 | MQD alone | 517 | 42.1 |
| Example 1-1 | MQD:SQ02 = 10000:1 | 517 | 41.9 |
|  | MQD:SQ02 = 1000:1 | 512 | 38.8 |
|  | MQD:SQ02 = 10:1 | — | — |
| Example 1-2 | MQD:VOPc = 10000:1 | 516 | 41.8 |
|  | MQD:VOPc = 1000:1 | 516 | 41.5 |
|  | MQD:VOPc = 10:1 | 513 | 41.7 |
| Reference Example 2 | HQD | 530 | 44 |
| Example 1-3 | HQD:SQ02 = 10000:1 | 530 | 43.7 |
|  | HQD:SQ02 = 1000:1 | 529 | 43.6 |
|  | HQD:SQ02 = 10:1 | — | — |
| Example 1-4 | HQD:VOPc = 10000:1 | 531 | 43.8 |
|  | HQD:VOPc = 1000:1 | 529 | 44.3 |
|  | HQD:VOPc = 10:1 | 528 | 45 |

The results of Table 1 confirm that the mixture solutions of the dye and the quantum dots may have a decreased full width at half maximum (FWHM) compared to the solution including the quantum dots alone.

Comparative Example 1

Preparation of Quantum Dot-Binder Dispersion 50 g of the quantum dots of Reference Example 1 is dispersed in 100 g of chloroform and mixed with 100 g of a binder solution (polypropylene glycol monomethyl ether acetate having a concentration of 30 wt %) including a four membered copolymer (acid value: 130 mg KOH/g, monomer ratio: methacrylic acid:benzyl methacrylate:hydroxyethyl methacrylate:styrene=61.5%:12%:16.3%:10.2%, molecular weight: 5000) of methacrylic acid, benzyl methacrylate, hydroxyethyl methacrylate, and styrene to provide a quantum dot-binder dispersion.

Preparation of Photosensitive Composition

To the quantum dot-binder dispersion obtained from above, 100 g of acrylate monomer having the following structure as a photopolymerizable monomer, 1 g of oxime ester compound as an initiator, and 300 g of PGMEA are added to provide a photosensitive composition:

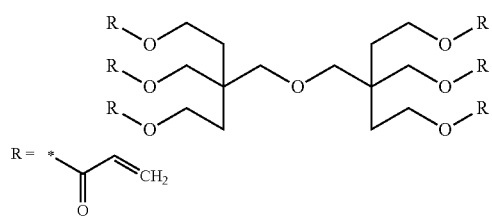

Preparation of a Quantum Dot-Polymer Composite Pattern

The photosensitive composition obtained from above is spin-coated on a glass substrate to provide a film. The obtained film is pre-baked at 100° C. The pre-baked film is irradiated with light (wavelength: 365 nm, intensity: 100 mJ) for a few seconds under a mask having a predetermined pattern, and developed with a potassium hydroxide aqueous solution (concentration: 0.043%) for 60 seconds, and the developed resultant material is heated at 180° C. for 30 minutes to provide a quantum dot-polymer composite pattern. It is confirmed that the obtained pattern has a line width of about 100 micrometers (μm).

The photoluminescence spectrum of the obtained quantum dot-polymer composite pattern is measured, and the photoluminescence peak wavelength, the full width at half maximum (FWHM), and the area at a wavelength of about 570 nm to about 650 nm are obtained therefrom, and the results are summarized in Table 2.

Comparative Example 2

A quantum dot-polymer composite pattern is obtained in accordance with the manner as set forth in Comparative Example 1, except that 30 g of the quantum dots of Reference Example 2 are dispersed in 100 g of chloroform. It is confirmed that the obtained pattern has a line width of about 100 μm.

The photoluminescence spectrum of the obtained quantum dot-polymer composite pattern is measured, and the photoluminescence peak wavelength, the full width at half maximum (FWHM), and the area at a wavelength of about 570 nm to about 650 nm are obtained therefrom, and the results are summarized in Table 2.

Example 2-1

A quantum dot-polymer composite pattern is obtained in accordance with the procedure as in Comparative Example 1, except that a solution including 100 g of chloroform and 50 g of the quantum dots of Reference Example 1 dispersed therein are mixed with the SQ02 dye at a ratio of MQD:SQ02=10000:1 and then further mixed with 100 g of binder solution (polypropylene glycol monomethyl ether acetate having a concentration of 30 wt %) to provide a quantum dot-dye binder dispersion. It is confirmed that the pattern has a line width of about 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

Example 2-2

A quantum dot-polymer composite pattern is obtained in accordance with the procedure as in Comparative Example 1, except that a solution including 100 g of chloroform and 50 g of the quantum dots of Reference Example 1 dispersed therein are mixed with the SQ02 dye at a ratio of MQD:SQ02=1000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM) and the area at a wavelength of 570 nm to 650 nm are obtained therefrom, and the results are summarized in Table 2.

Example 3-1

A quantum dot-polymer composite pattern is obtained in accordance with the procedure as in Comparative Example 1, except that a solution including 100 g of chloroform and 50 g of the quantum dots of Reference Example 1 dispersed therein are mixed with the VOPc dye at a ratio of MQD:VOPc=10000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

Example 3-2

A quantum dot-polymer composite pattern is obtained in accordance with the procedure as in Comparative Example 1, except that a solution including 100 g of chloroform and 50 g of the quantum dots of Reference Example 1 dispersed therein are mixed with the VOPc dye at a ratio of MQD:VOPc=1000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 580 nm to 650 nm are obtained therefrom, and the results are summarized in Table 2.

Example 4-1

A quantum dot-polymer composite pattern is obtained in accordance with the procedure as in Comparative Example 1, except that a solution including 100 g of chloroform and 50 g of the quantum dots of Reference Example 2 dispersed therein are mixed with the SQ02 dye at a ratio of HQD:SQ02=10000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

Example 4-2

A quantum dot-polymer composite pattern is obtained in accordance with the procedure as in Comparative Example 1, except that a solution including 100 g of chloroform and 50 g of the quantum dots of Reference Example 2 dispersed therein are mixed with the SQ02 dye at a ratio of HQD:SQ02=1000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

Example 5-1

A quantum dot-polymer composite pattern is obtained in accordance with the procedure as in Comparative Example 1, except that a solution including 100 g of chloroform and 50 g of the quantum dots of Reference Example 2 dispersed therein are mixed with the VOPc dye at a ratio of HQD:VOPc=10000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

Example 5-2

A quantum dot-polymer composite pattern is obtained in accordance with the procedure as in Comparative Example 1, except that a solution including 100 g of chloroform and 50 g of the quantum dots of Reference Example 2 dispersed therein are mixed with the VOPc dye at a ratio of HQD:VOPc=1000:1 and then further mixed with 100 g of binder solution (polypropylene glycol monomethyl ether acetate having a concentration of 30 wt %) to provide a quantum dot-dye-binder dispersion. It is confirmed that the pattern has a line width of 100 μm.

The photoluminescence spectrum of the obtained quantum dot-polymer composite pattern is measured, and the photoluminescence peak wavelength, the full width at half maximum (FWHM), and the area at a wavelength of 570 nm to 650 nm are obtained therefrom, and the results are summarized in Table 2.

TABLE 2

| | Quantum dot or quantum dot/dye mixture | Photoluminescence peak wavelength (nm) | FWHM (nm) | Tail area (570-650 nm) |
|---|---|---|---|---|
| Comparative Example 1 | MQD | 528 | 36.2 | 2.30 |
| Comparative Example 2 | HQD | 539 | 38.3 | 3.04 |
| Example 2-1 | MQD:SQ02 = 10000:1 | 526 | 36.3 | 2.01 |
| Example 2-2 | MQD:SQ02 = 1000:1 | 523 | 36.9 | 1.14 |
| Example 3-1 | MQD:VOPc = 10000:1 | 527 | 36.2 | 2.23 |
| Example 3-2 | MQD:VOPc = 1000:1 | 524 | 37.6 | 2.04 |
| Example 4-1 | HQD:SQ02 = 10000:1 | 539 | 38.1 | 2.72 |
| Example 4-2 | HQD:SQ02 = 1000:1 | 537 | 37.8 | 1.71 |
| Example 5-1 | HQD:VOPc = 10000:1 | 538 | 38.4 | 3.02 |
| Example 5-2 | HQD:VOPc = 1000:1 | 540 | 39.4 | 3.20 |

From Table 2, it is confirmed that the photoluminescence peak wavelength may be blue-shifted when the absorption type dye is added to quantum dots. It is confirmed that in the photoluminescence spectrum, the tail region area may be decreased when the dye (in particular, the SQ02 dye) is added.

Example 6

Color coordinate values (Cx, Cy), a NTSC color gamut ratio, an Adobe color gamut ratio, and a DCI color gamut ratio of quantum dot-polymer composite patterns obtained from Comparative Examples 1 to 2 and Examples 2-1 to 5-2 are obtained, and the results are shown in Table 3 and FIG. 8A, FIG. 8B, FIG. 8C, and FIG. 8D.

TABLE 3

| | Cx | Cy | NTSC | Adobe | DCI |
|---|---|---|---|---|---|
| MQD | 0.2243 | 0.7096 | 95.1% | 98.2% | 96.1% |
| HQD | 0.2847 | 0.6806 | 77.7% | 79.4% | 90.1% |
| MQD:SQ02 = 1000:1 | 0.1980 | 0.7255 | 97.7% | 100% | 95.5% |
| MQD:VOPc = 1000:1 | 0.2165 | 0.7143 | 95.3% | 98.5% | 96.1% |
| HQD:SQ02 = 1000:1 | 0.2835 | 0.6870 | 82.1% | 84.0% | 94.9% |
| HQD:VOPc = 1000:1 | 0.2999 | 0.6735 | 78.6% | 80.3% | 91.0% |

From the results of Table 3, it is confirmed that the color gamut ratio may be improved by using the quantum dot-absorption type dye mixture. From the results of FIG. 8A, FIG. 8B, FIG. 8C, and FIG. 8D, it is confirmed that the color coordinate values are shifted to 11 o'clock direction by using the quantum dot-absorption dye mixture.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A color filter comprising a quantum dot pattern comprising
a plurality of quantum dots; and
a color filter material comprising an absorption dye, an absorption pigment, or a combination thereof,
wherein in a normalized photoluminescence spectrum of the quantum dot and a normalized ultraviolet-visible absorption spectrum of the color filter material, a photoluminescence peak wavelength of the quantum dot and a wavelength of maximum absorbance of the color filter material do not overlap with each other,
wherein the color filter material is included in an amount of less than 1 part by weight per 10 parts by weight of the plurality of quantum dots,
wherein the quantum dot comprises a core comprising a first semiconductor nanocrystal and a shell disposed over the core and comprising a second semiconductor nanocrystal that is different from the first semiconductor nanocrystal.

2. The color filter of claim 1, wherein in the normalized photoluminescence spectrum of the quantum dot and the normalized ultraviolet-visible absorption spectrum of the color filter material, a range of the photoluminescence peak wavelength of the quantum dot and a range of the wavelength of maximum absorbance of the color filter material do not overlap with each other.

3. The color filter of claim 1, wherein in the normalized photoluminescence spectrum of the quantum dot and the normalized ultraviolet-visible absorption spectrum of the color filter material, an absorption initiation wavelength of the color filter material is present within or before a longer wavelength tail region of the quantum dot.

4. The color filter of claim 1, wherein in the normalized photoluminescence spectrum of the quantum dot and the normalized ultraviolet-visible absorption spectrum of the color filter material, an absorption termination wavelength of the ultraviolet absorption spectrum of the color filter material is present within or after a shorter wavelength tail region of the quantum dot.

5. The color filter of claim 1, wherein the quantum dot is a green light emitting quantum dot and the color filter material has an absorption initiation wavelength of greater than or equal to about 500 nanometers.

6. The color filter of claim 5, wherein the absorption initiation wavelength is greater than or equal to about 530 nanometers.

7. The color filter of claim 5, wherein the photoluminescence peak wavelength of the quantum dot is present in a range from about 500 nanometers to about 550 nanometers.

8. The color filter of claim 5, wherein a photoluminescence peak of the quantum dot has a longer wavelength tail of about 570 nanometers to about 650 nanometers.

9. The color filter of claim 1, wherein the quantum dot is a red light emitting quantum dot and the color filter material has an absorption initiation wavelength of greater than or equal to about 600 nanometers.

10. The color filter of claim 9, wherein the absorption initiation wavelength of greater than or equal to about 630 nanometers.

11. The color filter of claim 9, wherein the photoluminescence peak wavelength of the quantum dot is present in a range from about 600 nanometers to about 700 nanometers.

12. The color filter of claim 9, wherein a photoluminescence peak of the quantum dot has a longer wavelength tail of about 650 nanometers to about 700 nanometers.

13. The color filter of claim 1, wherein the quantum dot is a red light emitting quantum dot and the color filter material has an absorption termination wavelength of less than or equal to about 600 nanometers.

14. The color filter of claim 13, wherein the absorption initiation wavelength of less than or equal to about 590 nanometers.

15. The color filter of claim 13, wherein the photoluminescence peak wavelength of the quantum dot is present in a range from about 600 nanometers to about 700 nanometers.

16. The color filter of claim 13, wherein a photoluminescence peak of the quantum dot has a shorter wavelength tail of about 550 nanometers to about 600 nanometers.

17. The color filter of claim 1, wherein the quantum dot comprises an organic ligand having a hydrophobic moiety on a surface thereof, and the organic ligand comprises $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein, R and R' are independently a C5 to C24 aliphatic hydrocarbon group or a C5 to C20 aromatic hydrocarbon group), or a combination thereof.

18. The color filter of claim 1, wherein the quantum dot comprises a Group II-VI compound, a Group III-V compound, a Group IV-VI compound, a Group IV compound, a Group compound, a Group I-II-IV-VI compound, or a combination thereof.

19. The color filter of claim 1, wherein the absorption dye or pigment comprises an organometallic complex, a coumarin compound, a rhodamine compound, a phenoxazone compound, a stilbene compound, a terphenyl compound, a quaterphenyl compound, a perylene compound, a diketopyrrolopyrrole compound, a phthalocyanine compound, an anthraquinone compound, a squaraine compound, or a combination thereof.

20. The color filter of claim 1, wherein the quantum dot pattern further includes a polymer binder and the polymer binder comprises a carboxyl group.

21. The color filter of claim 20, wherein the polymer binder has an acid value of greater than or equal to about 50 milligrams of potassium hydroxide per gram of the polymer binder.

22. The color filter of claim 1, wherein the quantum dot pattern comprises at least two repeating sections and one of the repeating sections is a section emitting red light and the other of the repeating sections is a section emitting green light.

23. The color filter of claim 1, wherein the first semiconductor nanocrystal comprises a Group II-VI compound and the second semiconductor nanocrystal comprises a Group II-VI compound.

24. The color filter of claim 1, wherein the color filter material is included in an amount of less than about 1 part by weight per 100 parts by weight of the plurality of quantum dots.

25. The color filter of claim 1, wherein the color filter material is included in an amount of less than or equal to about 0.5 parts by weight per 100 parts by weight of the plurality of quantum dots.

26. A display device comprising a color filter of claim 1.

27. The display device of claim 26, wherein a National Television System Committee color gamut ratio of the quantum dot pattern is larger than that of the quantum dot.

28. The color filter of claim 1, wherein the color filter material is included in an amount of less than or equal to about 9 parts by weight per 100 parts by weight of the plurality of quantum dots.

29. The color filter of claim 1, wherein the color filter material is included in an amount of less than or equal to about 8 parts by weight per 100 parts by weight of the plurality of quantum dots.

30. The color filter of claim 1, wherein the color filter material is included in an amount of less than or equal to about 5 parts by weight per 100 parts by weight of the plurality of quantum dots.

31. The color filter of claim 1, wherein the color filter material is included in an amount of less than or equal to about 0.1 parts by weight per 100 parts by weight of the plurality of quantum dots.

32. The color filter of claim 1, wherein the color filter material is included in an amount of less than or equal to about 0.05 parts by weight per 100 parts by weight of the plurality of quantum dots.

* * * * *